United States Patent [19]

Urano et al.

[11] Patent Number: 5,670,299
[45] Date of Patent: Sep. 23, 1997

[54] PATTERN FORMATION PROCESS

[75] Inventors: Fumiyoshi Urano; Hirotoshi Fujie; Keiji Oono; Takaaki Negishi, all of Kawagoe, Japan

[73] Assignee: Wako Pure Chemical Industries, Ltd., Osaka, Japan

[21] Appl. No.: 477,612

[22] Filed: Jun. 7, 1995

Related U.S. Application Data

[62] Division of Ser. No. 898,265, Jun. 15, 1992, Pat. No. 5,468,589.

[30] Foreign Application Priority Data

Jun. 18, 1991 [JP] Japan ............... 3-173197
Sep. 26, 1991 [JP] Japan ............... 3-274829

[51] Int. Cl.$^6$ ............... G03F 7/30; G03F 7/004
[52] U.S. Cl. ............... 430/326; 430/170; 430/270.1; 430/330; 430/907; 430/909; 430/942
[58] Field of Search ............... 430/270.1, 330, 430/326, 942, 170, 907, 909

[56] References Cited

U.S. PATENT DOCUMENTS

| | | | |
|---|---|---|---|
| 3,100,804 | 8/1963 | Abramo | 526/334 |
| 3,798,034 | 3/1974 | Laridon | 430/143 |
| 3,847,610 | 11/1974 | Laridon et al. | 430/921 |
| 4,101,323 | 7/1978 | Buhr et al. | 430/270 |
| 4,491,628 | 1/1985 | Ito et al. | 430/176 |
| 4,601,969 | 7/1986 | Clecak et al. | 430/189 |
| 4,603,101 | 7/1986 | Crivello | 430/270 |
| 4,678,737 | 7/1987 | Schneller et al. | 430/270 |
| 4,828,958 | 5/1989 | Hayase et al. | 430/175 |
| 5,110,709 | 5/1992 | Aoai et al. | 430/326 |
| 5,130,392 | 7/1992 | Schwalm et al. | 430/170 |
| 5,135,838 | 8/1992 | Houlihan et al. | 430/270 |
| 5,151,341 | 9/1992 | Kim | 430/270 |
| 5,343,885 | 9/1994 | Reardon | 430/270 |
| 5,350,660 | 9/1994 | Urano et al. | 430/270.1 |
| 5,403,695 | 4/1995 | Hayase et al. | 430/270 |

FOREIGN PATENT DOCUMENTS

| | | |
|---|---|---|
| 342 498 | 5/1989 | European Pat. Off. . |
| 0440374 | 8/1991 | European Pat. Off. . |
| 0440376 | 8/1991 | European Pat. Off. . |
| 2305757 | 10/1976 | France . |
| 0417556 | 3/1991 | Germany . |
| 0417557 | 3/1991 | Germany . |
| 63-36602 | 7/1988 | Japan . |
| 64-80944 | 3/1989 | Japan . |
| 1-155339 | 6/1989 | Japan . |
| 1-155338 | 6/1989 | Japan . |
| 1-154048 | 6/1989 | Japan . |
| 1-188852 | 7/1989 | Japan . |
| 2-12153 | 1/1990 | Japan . |
| 2-25850 | 1/1990 | Japan . |
| 2-62544 | 3/1990 | Japan . |
| 2-161436 | 6/1990 | Japan . |
| 2-209977 | 8/1990 | Japan . |
| 3-83063 | 4/1991 | Japan . |
| 3-223865 | 10/1991 | Japan . |
| 476-865 | 3/1992 | Japan . |
| 1231789 | 5/1971 | United Kingdom . |

OTHER PUBLICATIONS

Patent Abstracts of Japan, vol. 14, No. 415 (P-1102) 7 Sep. 1990 of JP-A-2 161 436 (Oki Electric Ind Co Ltd) 21 Jun. 1990.
Reichmanis et al., Chemistry and Processes for Deep-UV Resists, Microelectric Engineering, vol. 13, No. 1/4, pp. 3-10, Mar., 1991, Amsterdam NL.
Polymer Bulletin 29 (1988), pp. 427-434.
Polymer Material Sci. Eng., 61 (1989), pp. 412-416.
Polymer Engineering and Science, Dec. 1983, vol.23, No. 18, pp. 1012-1018.
SPIE vol. 1262 Advances in Resist Technology and Processing VII (1990), pp. 8-15.
SPIE vol. 1262 Advances in Resist Technology and Processing VII (1990), pp. 16-25.
J. Vac. Sci. Technol. B 9 (2), Mar./Apr. 191, pp. 278-289.
SPIE vol. 1086 Advances in Resist Technology and Processing VI (1989), pp. 22-33.
SPIE vol. 1086 Advances in Resist Technology and Processing VI (1989), pp. 357-362.
SPIE vol. 1086 Advances in Resist Technology and Processing VI (1989), pp. 2-10.

*Primary Examiner*—John S. Chu
*Attorney, Agent, or Firm*—Armstrong, Westerman, Hattori, McLeland, & Naughton

[57] ABSTRACT

A resist composition comprising (a) a polymer having at least repeating units of the formulae:

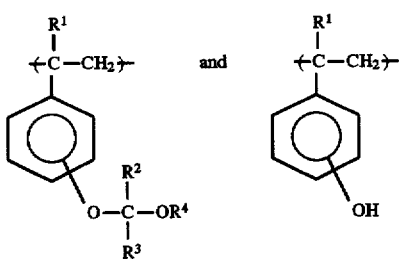

(b) a photoacid generator and (c) a solvent, has high sensitivity to light, excellent heat resistance, adhesiveness to a substrate and suitable for pattern formation with high resolution.

18 Claims, 3 Drawing Sheets

PATTERN FORMATION PROCESS

This is a division, of application Ser. No. 07/898,265 filed Jun. 15, 1992, now U.S. Pat. No. 5,468,589.

BACKGROUND OF THE INVENTION

This invention relates to a resist material used for production of a semiconductor device, etc. Particularly, the present invention relates to a resist material for forming a positive pattern using deep ultraviolet (DUV) light having a wavelength of 300 nm or less, such as KrF excimer laser beams having a wavelength of 248.4 nm, etc.

In recent years, the wavelength of light from the light source of an exposing apparatus used for micro-fabrication, in particular, photolithography has been shortened with an enhancement of the degree of integration of semiconductor devices. Currently, employment of KrF excimer laser beams (248.4 nm) is being investigated. However, a resist material suitable for this wavelength has not yet been found.

For example, as resist materials used in the case of using a light source capable of emitting KrF excimer laser beams or deep ultraviolet light, there have been developed dissolution-inhibiting type resist materials comprising a resin having high transmittance for light of near 248.4 nm and a photosensitive compound having a diazodiketo group in the molecule (for example, Japanese Patent Unexamined Publication Nos. 1-80944, 1-154048, 1-155338, 1-155339 and 1-188852, and Y. Tani et al., SPIE's 1989 Sympo., 1086-03, etc.). However, these dissolution-inhibiting type resist materials, in common with one another, have a low sensitivity and hence cannot be used in the case of employment of deep ultraviolet light or KrF excimer laser beams which requires a highly sensitive resist material. On the other hand, for reduction of the amount of exposure energy (enhancement of the sensitivity), there has been proposed recently a chemical amplified type resist material in which an acid generated by exposure to light is used as a catalyst [H. Ito et al., Polym. Eng. Sci., 23, 1012 (1983)]. On such chemical amplified type resist materials, various reports have been presented [for example, H. Ito et al., U.S. Pat. No. 4,491,628 (1985); J. V. Crivello, U.S. Pat. No. 4,603,101 (1986); W. R. Brunsvolt et al., SPIE's 1989 Sympo., 1086-40; T. Neeman et al., SPIE's 1989 Sympo., 1086-01; and Japanese Patent Unexamined Publication No. 62-115440). Such chemical amplified type resist materials, however, involve the following problems. When there is used in them a phenol ether type resin such as poly(4-tert-butoxycarbonyloxystyrene), poly(4-tert-butoxycarbonyloxy-α-methylstyrene), poly(4-tert-butoxystyrene), poly(4-tert-butoxy-α-methylstyrene) or the like, all of the chemical amplified type resist materials have poor heat resistance and are disadvantageous in that because of their low adhesive properties to a substrate, film peeling tends to occur during development, so that no satisfactory pattern can be obtained. When there is used a carboxylic acid type resin such as poly(tert-butyl-4-vinylbenzoate) or the like, the chemical amplified type resist materials are insufficient in light-transmitting properties near 248.4 nm because of the aromatic ring. When there is used a poly (tert-butylmethacrylate) or the like, the heat resistance and dry etching resistance of this resin are poor. A resist material using a silyl group-containing polymer is also disclosed (e.g. Japanese Patent Examined Publication No. 3-44290, etc.). When p-trimethyl-silyloxystyrene polymer or p-tert-butylidmethylsilyloxy-styrene polymer is used, there arise problems in that the sensitivity is low, complete stripping off of the resist by ashing according to an oxidizing plasma process is impossible due to containing silicon, etc. Thus, practical application was almost impossible.

As resist materials free from the above defects, there have recently been reported a resist material obtained by use of a copolymer of p-tert-butoxycarbonyloxystrene and p-hydroxystyrene (Japanese Patent Unexamined Publication No. 2-209977), resist materials obtained by use of a copolymer of p-tetrahydropyronyloxystyrene and p-hydroxystyrene (Japanese Patent Unexamined Publication Nos. 2-19847, 2-161436 and 2-25850), a resist material obtained by use of a copolymer of p-tert-butoxystyrene and p-hydroxystyrene (Japanese Patent Unexamined Publication No. 2-62544), etc. However, when these copolymers such as p-tert-butoxycarbonyloxystyrene/p-hydroxystyrene, p-tetrahydropyranyloxystyrene/p-hydroxystyrene, p-tert-butoxystyrene/p-hydroxystyrene, etc. are used as the resin component, it is necessary to make a strong acid present as a catalyst in order to maintain high sensitivity and to release protective groups such as a tert-butoxycarbonyl group, a tetrapyranyl group, a tert-butyl group, etc. for obtaining alkali solubility. In order to attain such a purpose, there is used a photosensitive compound which generates a remarkably strong acid by exposure to light, e.g. a triphenylphosphonium salt, a diphenyliodonium salt, tris(trichloromethyl)-s-triazine/triethanolamine, or the like, in a resist material containing the above-mentioned copolymer as the resin component. When a pattern formation is carried out in the presence of such a strong acid, there often takes place a remarkable dimensional change of pattern with a time delay between exposure and post exposure bake (PEB), and sometimes no pattern is formed. Thus, even if a pattern can be formed in a remarkably short time, a good pattern formation cannot be expected in a practical production wherein a considerable time is required from the light exposure to heating treatment.

Further, the above-mentioned photosensitive compounds are generally unstable, so that resist materials containing them are also poor in storage stability. In any way, there is a problem in that these cannot be used as they are.

A further problem of the above-mentioned polymers or copolymers is in that the group used as a protective group for the hydroxyl group (e.g. a tert-butoxycarbonyl group, a tert-butyl group, a trimethylsilyl group, a tetrahydropyranyl group, etc.) is not completely released even in the presence of a strong acid. Thus, a polymer or copolymer containing a monomer component having a hydroxyl group protected with such a protective group is used as a resin component in a resist material, the difference in dissolution rate for an alkali developer between light exposed portions and non-exposed portions of the resist material is small, resulting in insufficient resolution ability.

Although thus the chemical amplified type resist materials have a higher sensitivity than do conventional resist materials, they involve problems of, for example, poor heat resistance of resin, poor adhesive properties to a substrate, insufficient transmittance for light of near 248.4 nm, insufficient resolution, and change of the dimensions of a pattern with a time delay between exposure and post exposure bake (PEB). Therefore, they are difficult to put to practical use. Accordingly, there is eagerly desired a practical highly sensitive resist material free from all of the above problems.

SUMMARY OF THE INVENTION

This invention was made in consideratin of such conditions and is intended to provide a practical positive type resist material (photoresist composition) which is highly pervious to deep ultraviolet light. KrF excimer laser beams, etc., is highly sensitive to exposure by means of a source of such light and irradiation with electron beams or X-rays, is very excellent in heat resistance and adhesive properties to a substrate, has high resolution, and can give a highly precise pattern without a change of the dimensions of the pattern with a time delay between exposure and post exposure bake.

This invention provides a photoresist composition comprising (a) a polymer having repeating units of the formula:

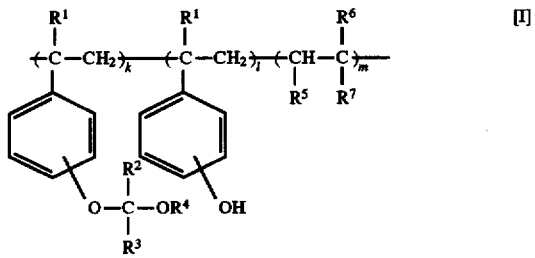

wherein $R^1$ is a hydrogen atom or a methyl group; $R^2$ and $R^3$ are independently a hydrogen atom, or a linear, branched or cyclic alkyl group having 1 to 6 carbon atoms (except for the case where both $R^2$ and $R^3$ are hydrogen atoms), a combination of $R^2$ and $R^3$ being able to form a methylene chain having 2 to 5 carbon atoms; $R^4$ is a linear, branched or cyclic alkyl group having 1 to 10 carbon atoms, a linear, branched or cyclic haloalkyl group having 1 to 6 carbon atoms, or an aralkyl group; $R^5$ is a hydrogen atom or a cyano group; $R^6$ is a hydrogen atom or a methyl group; $R^7$ is a hydrogen atom, a cyano group or —COOY (Y is a linear, branched or cyclic alkyl group having 1 to 6 carbon atoms); $R^5$ and $R^7$ may bind to each other to form —CO—O—CO—; k and l are independently a natural number $(0.1 \leq k/(k+l) \leq 0.9)$; and m is zero or a natural number (when m is a natural number, $0.05 \leq m/(k+l+m) \leq 0.50$). (b) a photosensitive compound which generates an acid upon exposure to light, and (c) a solvent capable of dissolving the components (a) and (b).

This invention also provides a process for forming a pattern, which comprises (i) a step of coating the aforesaid photoresist composition on a substrate, (ii) a step of exposing the coating to light having a wavelength of 300 nm or less through a mask after heat treatment, and (iii) a step of developing the coating by use of a developing solution after carrying out heat treatment if necessary.

DESCRIPTION OF THE PREFERRED EMBODIMENTS

Figure 1:
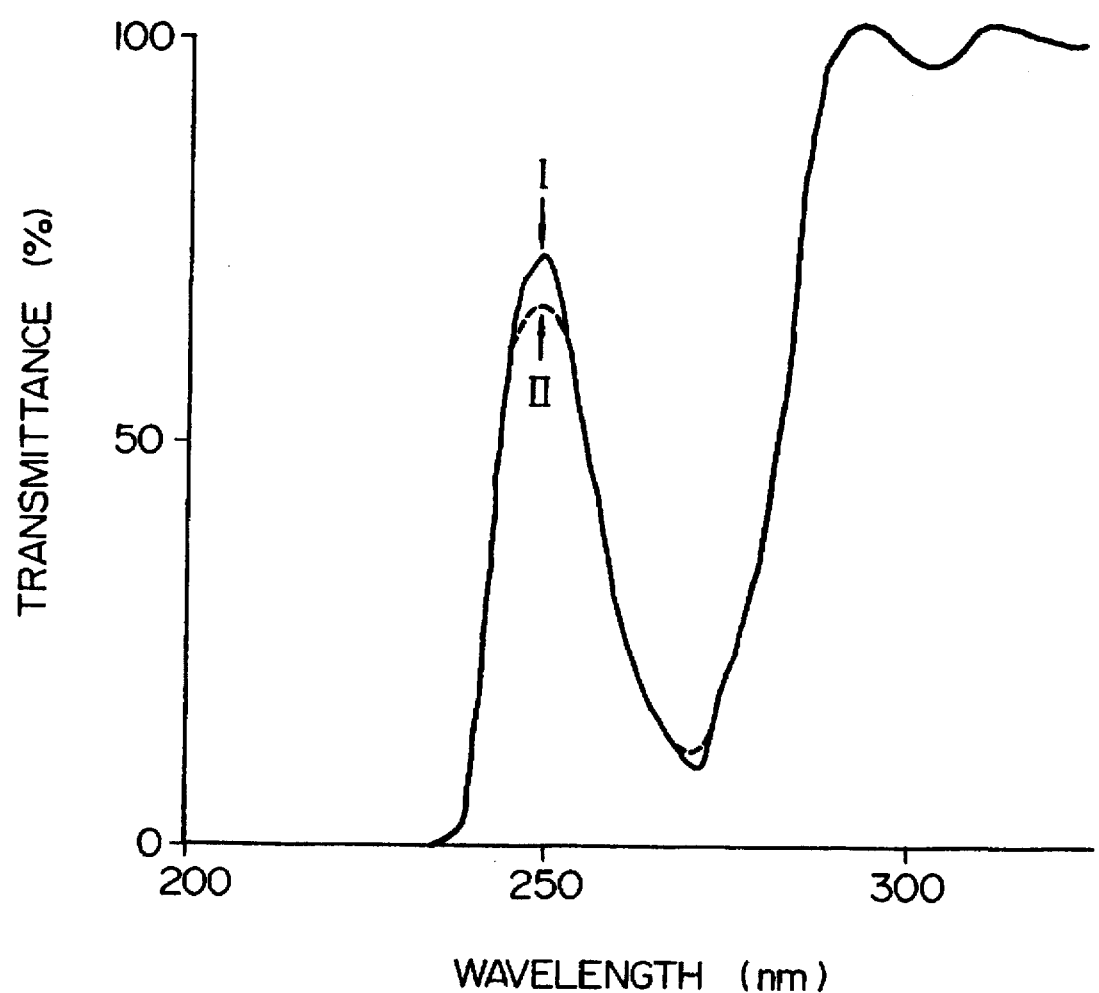
FIG. 1 is a graph showing ultraviolet spectrophotometric curves of the individual polymer films obtained in Example 1.

The polymers used in the photoresist compositions of this invention are as follows.

A polymer having repeating units of the following formula:

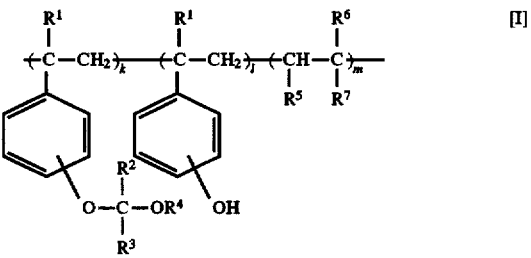

wherein $R^1$ is a hydrogen atom or a methyl group; $R^2$ and $R^3$ are independently a hydrogen atom or a linear, branched or cyclic alkyl group having 1 to 6 carbon atoms (except for the case where both $R^2$ and $R^3$ are hydrogen atoms), a combination of $R^2$ and $R^3$ being able to form a methylene chain having 2 to 5 carbon atoms; $R^4$ is a linear, branched or cyclic alkyl group having 1 to 10 carbon atoms, a linear, branched or cyclic haloalkyl group having 1 to 6 carbon atoms, or an aralkyl group; $R^5$ is a hdyrogen atom or a cyano group; $R^6$ is a hydrogen atom or a methyl group; $R^7$ is a hydrogen atom, a cyano group or —COOY (Y is a linear, branched or cyclic alkyl group having 1 to 6 carbon atoms); $R^5$ and $R^7$ may bind to each other to form —CO—O—CO—; k and l are independently a natural number $(0.1 \leq k/(k+l) < 0.9)$; and m is zero or a natural number (when m is a natural number, $0.05 \leq m/(k+l+m) \leq 0.50$).

When m is zero in formula [I], the resulting polymer has repeating units represented by the formula:

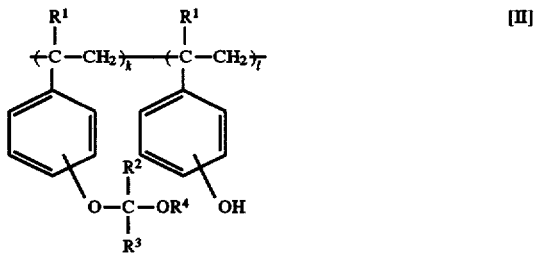

wherein $R^1$, $R^2$, $R^3$, $R^4$, k and l are as defined above.

More preferably, polymers of formula [I] or [II] are used in which $R^1$ is a hydrogen atom; $R^2$ is a hydrogen atom or a linear or branched alkyl group having 1 to 6 carbon atoms; $R^3$ is a linear or branched alkyl group having 1 to 6 carbon atoms; and $R^4$ is a linear or branched alkyl group having 1 to 10 carbon atoms.

There are also more preferably used polymers of formula [I] or [II] in which $R^1$ is a hydrogen atom; $R^2$ is a hydrogen atom or a methyl group; $R^3$ is a methyl group or an ethyl group; and $R^4$ is a linear or branched alkyl group having 1 to 4 carbon atoms.

In formula [I] as the alkyl groups having 1 to 6 carbon atoms represented by $R^2$ and $R^3$, the alkyl group of the haloalkyl group having 1 to 6 carbon atoms represented by $R^4$, and the alkyl group having 1 to 6 carbon atoms represented by Y of —COOY represented by $R^7$, there can be exemplified methyl group, ethyl group, propyl group, butyl group, amyl group and hexyl group which may be linear, branched or cyclic. The alkyl group having 1 to 10 carbon atoms represented by $R^4$ includes methyl group, ethyl group, propyl group, butyl group, amyl group, hexyl group, heptyl group, octyl group, nonyl group and decyl group which may be linear, branched or cyclic. The halogen of the haloalkyl group having 1 to 6 carbon atoms represented by $R^4$ includes chlorine, bromine, fluorine and iodine. The aralkyl group represented by R⁴ includes, for example, benzyl group, phenethyl group, phenylpropyl group, methylbenzyl group, methylphenethyl group and ethylbenzyl group.

The polymer of formula [I] used in this invention has its most marked characteristic in that it comprises units having a functional group of the formula:

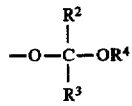

[VIII]

Wherein R², R³ and R⁴ are as defined above, which can be removed by an acid, namely, an alkoxyalkyl group, a haloalkoxyalkyl group or an aralkyloxyalkyl group, that is, the polymer comprises monomeric units of the formula:

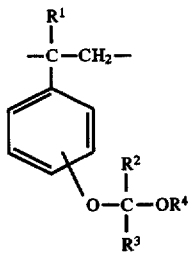

[IX]

wherein R¹, R², R³ and R⁴ are as defined above. In particular, the functional group of the formula [VIII] can much more easily be removed by an acid than conventional functional groups such as tert-butoxycarbonyl group, tert-butyl group, tetrahydropyranyl group, etc., and hence is much more advantageous than them for improving the resolution and maintaining the dimensions of a pattern.

Specifically, the monomeric unit of the formula [IX] is that derived from a monomer such as p- or m-hydroxystyrene derivative, p- or m-hydroxy-α-methylstyrene derivative or the like which has a functional group of the formula [VIII]. Specific examples of the monomer are p- or m-1-methoxy-1-methylethoxystyrene, p- or m-1-benzyloxy-1-methylethoxystyrene, p or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or m-1-(2-chloroethoxy)ethoxystyrene, p- or m-1-cyclohexyloxyethoxystyrene, p- or m-1-cyclopentyloxyethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-ethoxypropoxystyrene, p- or m-1-methoxybutoxystyrene, p- or m-1-methoxycyclohexloxystyrene, and p- or m-hydroxy-α-methylstyrene derivatives having the same protecting groups as those of the above p- or m-hydroxystyrene derivatives. Of such monomeric units, monomeric units of the formula [IX] in which both R² and R³ are alkyl groups (for example, monomeric units derived from p- or m-1-methoxy-1-methylethoxystyrene, p- or m-1-benzyloxy-1-methylethoxystyrene, p- or m-1-(1,1-dimethylethoxy)-1-methylethoxystyrene, p- or m-1-ethoxy-1-methylethoxystyrene, p- or m-1-methyl-1-n-propoxyethoxystyrene, etc.) are preferable for the improvement of the resolution which is one of the objects of this invention, because their protecting groups are very easily removable by the action of an acid. The polymer used in this invention is a copolymer comprising, besides the monomeric units of the above formula [IX], monomeric units of the formula:

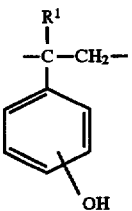

[X]

wherein R¹ is as defined above, and optionally monomeric units of the formula;

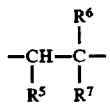

[XI]

wherein R⁵, R⁶ and R⁷ are as defined above. The monomeric unit of the formula [IX] is that derived from a monomer having a phenolic hydroxyl group. Specific examples of the monomer are p- or m-vinylphenol and p- or m-hydroxy-α-methylstyrene. As the monomeric units of the formula [XI], i.e., the third component of the polymer used in this invention, there can be exemplified monomeric units derived from acrylonitrile, fumaronitrile, methyl methacrylate, tert-butyl methacrylate, maleic anhydride, etc.

In the polymer used in this invention (including both of the formulae [I] and [II], the ratio of the monomeric units of the formula [IX] to the monomeric units of the formula [IX] is usually 1:9 to 9:1. Although the polymer can be used in the photoresist composition of this invention when any ratio is employed in the above range, there is preferably employed a ratio of 2:8 to 7:3 which greatly improves the heat resistance of the polymer and the adhesive properties to a substrate.

Specific examples of the polymer used in this invention are p-1-methoxy-1-methylethoxystyrene/p-hydroxystyrene polymers, p-1-benzyloxy-1-methylethoxy-styrene/p-hydroxystyrene polymers, p-1-ethoxyethoxy-styrene/p-hydroxystyrene polymers, p-1-methoxyethoxy-styrene/p-hydroxystyrene polymers, p-1-n-butoxyethoxy-styrene/p-hydroxystyrene polymers, p-1-isobutoxyethoxy-styrene/p-hydroxystyrene polymers, p-1-(1,1-dimethyl-ethoxy)-1-methylethoxystyrene/p-hydroxystyrene polymers, m-1-(2-chloroethoxy)ethoxystyrene/m-hydroxystyrene polymers, p-1-cyclohexyloxyethoxystyrene/p-hydroxystyrene polymers, m-1-(2-ethylhexyloxy)ethoxystyrene/m-hydroxystyrene polymers, p-1-methoxy-1-methylethoxy-α-methylstyrene/p-hydroxy-α-methylstyrene polymers, p-1-ethoxyethoxystyrene/p-hydroxystyrene/acrylonitrile polymers, p-1-ethoxyethoxystyrene/p-hydroxystyrene/ fumaronitrile polymers, p-1-n-butoxyethoxystyrene/p-hydroxystyrene/methyl methacrylate polymers, p-1-cyclohexyl-1-ethoxyethoxystyrene/p-hydroxystyrene/tert-butyl methacrylate polymers, p-1-methoxycyclohexyloxystyrene/p-hydroxystyrene polymers, p-1-ethoxy-1-methylethoxystyrene/p-hydroxystyrene polymers, p-1-cyclopentyloxyethoxystyrene/p-hydroxystyrene polymers, p-1-(2-chloroethoxy)ethoxystyrene/p-hydroxystyrene/tert-butyl methacrylate polymers, m-1-cyclohexyloxyethoxystyrene/m-hydroxystyrene/maleic anhydride polymers, etc. Needless to say, the polymer used in this invention is not limited to them.

The polymer used in this invention can easily be obtained, for example, by the following 4 methods.

[Method-1]

A monomer of the formula:

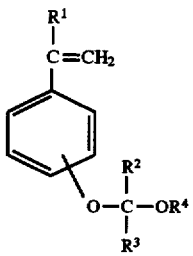

(wherein $R^1$, $R^2$, $R^3$ and $R^4$ are as defined above) which has a functional group of the above formula [VIII], is subjected alone or together with the third monomer to polymerization reaction according to a conventional polymer production process at 50° to 110° C. for 1 to 10 hours in a nitrogen or argon stream in an organic solvent such as benzene, toluene, tetrahydrofuran or 1,4-dioxane in the presence of a free-radical initiator [for example, an azo polymerization initiator such as 2,2'-azobis-isobutyronitrile, 2,2'-azobis(2,4-dimethylvaleronitrile) or 2,2'-azobis (methyl 2-methylpropionate ), or a peroxide type polymerization initiator such as benzoyl peroxide or lauroyl peroxide]. After completion of the reaction, after-treatment is carried out according to a conventional polymer-collecting method to isolate a homopolymer consisting of monomeric units of the above formula [IX] or a copolymer comprising monomeric units of the above formula [IX]. Then, the homopolymer or the copolymer is reacted with a suitable acid [preferably, for example, a Lewis acid such as sulfuric acid, phosphoric acid, hydrochloric acid or hydrobromic acid, or an organic acid such as p-toluenesulfone acid, malonic acid, oxalic acid] at 30° to 100° C. for 1 to 10 hours in an organic solvent such as tetrahydrofuran, acetone or 1,4-dioxane to remove the functional group of the above formula [VIII] at an optional rate. After completion of the reaction, after-treatment is carried out according to a conventional polymer-collecting method to isolate the desired polymer.

[Method-2]

A monomer having a functional group of the above formula [VIII], p- or m-hydroxystyrene, p- or m- hydroxy-α-methylstyrene and optionally the third monomer are copolymerized by the same procedure as described in Method-1. Then, after-treatment is carried out according to a conventional polymer-collecting method to isolate the desired polymer.

[Method-3]

Commercially available p-tert-butoxystyrene is subjected alone or together with the third monomer to polymerization reaction by the same procedure as described in Method-1 to obtain a poly(p-tert-butoxy-styrene) or a copolymer comprising p-tert-butoxystyrene units. The poly(p-tert-butoxystyrene) or the copolymer is reacted with a suitable acid [preferably, for example, a Lewis acid such as sulfuric acid, phosphoric acid, hydrochloric acid or hydrobromic acid, or an organic acid such as p-toluenesulfonic acid, malonic acid, oxalic acid] at 30° to 110° C. for 1 to 20 hours in an organic solvent such as tetrahydrofuran, acetone or 1,4-dioxane to remove the tert-butyl group, i.e., the functional group completely. The thus obtained poly(p-hydroxystyrene) or copolymer comprising monomeric units of the formula [X] is reacted with an optional amount of a vinyl ether compound or an isopropenyl ether compound, which is represented by the formula:

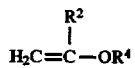

wherein $R^2$ and $R^4$ are as defined above, at 10° to 100° C. for 1 to 20 hours in an organic solvent such as tetrahydrofuran, acetone, 1,4-dioxane, methylene chloride or dimethoxyethane in the presence of a suitable acid [e.g. sulfuric acid, hydrochloric acid, p-toluenesulfonic acid, pyridine salt of chlorosulfonic acid, pyridine salt of sulfuric acid, or pyridine salt of p-toluenesulfonic acid] to introduce a functional group of the above formula [VIII] into the poly(p-hydroxystyrene) or the copolymer chemically at an optional rate. Then, after-treatment is carried out according to a conventional polymer-collecting method to isolate the desired polymer.

[Method-4]

A commercially available poly(p-hydroxystyrene) is reacted with an optional amount of a vinyl ether compound or an isopropenyl ether compound, which is represented by the above formula [XIII], by the same procedure as described in Method-3. Then, after-treatment is carried out according to a conventional polymer-collecting method to isolate the desired polymer.

Among the above-mentioned four processes, Method-1 and Method-3 are particularly preferable which can give a polymer having good light-transmitting properties near 248.4 nm. In Method-2 and method-4, p- or m-hydroxystyrene is employed in the polymerization causes oxidation, etc., so that the resulting polymer shows a tendency to lower light-transmitting properties near 248.4 nm.

The average molecular weight of the polymer used in this invention is not critical so long as the polymer can be utilized in the photoresist composition. Usually, the weight average molecular weight of the polymer is preferably about 1,000 to about 40,000, more preferably about 3,000 to about 25,000, as determined by a GPC measuring method using a polystyrene as a standard.

As the photosensitive compound capable of generating an acid upon exposure to light (hereinafter abbreviated as "photoacid generator") which is used in this invention, any photosensitive compound may be used so long as it generates an acid upon exposure to light and has no undesirable influence on the formation of a resist pattern. There is preferably used, in particular, a photoacid generator which has good light-transmitting properties near 248.4 nm and hence can maintain the high transparency of the photoresist composition, or a photoacid generator which is improved in light-transmitting properties in the vicinity of 248.4 nm by exposure to light and hence can maintain the high transparency of the photoresist composition. As photo-acid generators particularly preferable in this invention, there can be exemplified compounds of the following formula [III], formula [V], formula [VI] or formula [VII]:

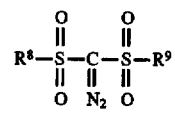

wherein $R^8$ and $R^9$ are independently a linear, branched or cyclic alkyl group having 1 to 10 carbon atoms, a haloalkyl group having 1 to 10 carbon atoms, or a group of the formula:

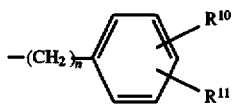 [IV]

wherein $R^{10}$ and $R^{11}$ are independently a hydrogen atom, a linear or branched alkyl group having 1 to 5 carbon atoms, or a haloalkyl group having 1 to 5 carbon atoms which may be either linear or branched; and n is zero or a natural number.

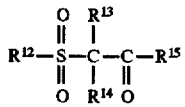 [V]

wherein $R^{12}$ is a linear, branched or cyclic alkyl group having 1 to 10 carbon atoms, an aralkyl group, a trifluoromethyl group, a phenyl group or a tolyl group; $R^{13}$ and $R^{14}$ are independently a hydrogen atom, or a linear or branched alkyl group having 1 to 5 carbon atoms; and $R^{15}$ is a linear, branched or cyclic alkyl group having 1 to 10 carbon atoms, a phenyl group, a halogen-substituted phenyl group, an alkyl-substituted phenyl group, an alkoxy-substituted phenyl group, or an alkylthio-substituted phenyl group.

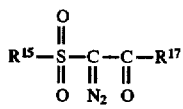 [VI]

wherein $R^{16}$ is a linear, branched or cyclic alkyl group having 1 to 10 carbon atoms, an aralkyl group, a trifluoromethyl group, a phenyl group or a tolyl group; and $R^{17}$ is a linear, branched or cyclic alkyl group having 1 to 10 carbon atoms, an aralkyl group or an alkoxy group.

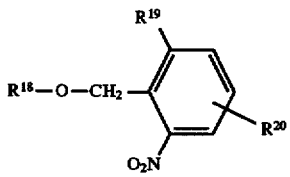 [VII]

wherein $R^{18}$ is a trichloroacetyl group, a p-toluene-sulfonyl group, a p-trifluoromethylbenzenesulfony group, a methanesulfonyl group or a trifluoromethanesulfonyl group; and $R^{19}$ and $R^{20}$ are independently a hydrogen atom, a halogen atom or a nitro group.

Specific examples of photoacid generator preferable in this invention are bis(p-toluenesulfonyl)-diazomethane, methylsulfonyl p-toluenesulfonyldiazo-methane, 1-cyclohexylsulfonyl-1-(1,1-dimethylethyl-sulfonyl)diazomethane, bis(1,1-dimethylethylsulfonyl)-diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthio)propiophenone, 2,4-dimethyl-2-(p-toluenesulfonyl)pentan-3-one, 1-diazo-1-methyl-sulfonyl-4-phenyl-2-butanone, 2-(cyclohexylcarbonyl)-2-(p-toluenesulfonyl)propane, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl 2-diazo-2-methanesulfonylacetate, cyclohexyl 2-diazo-2-benzenesulfonylacetate, tert-butyl 2-diazo-2-(p-toluenesulfonyl)acetate, 2-nitrobenzyl p-toluene-sulfonate, 2,6-dinitrobenzyl p-toluenesulfonate, 2,4-dinitrobenzyl p-trifluoromethylbenzenesulfonate, etc. Needless to say, the photoacid generator used in this invention is not limited to them.

As photoacid generators other than the above photoacid generators, various triphenylsulfonium salts and diphenyliodonium salts, etc. have heretofore been known. But, when they are used as photoacid generators in chemical amplified type resist materials, acids (Lewis acids) generated by exposure to light are strong acids and are highly volatile. Therefore, the acids are volatilized from the surface layer of a resist film after the exposure to light or are very susceptible to the influence of the atmosphere, for example, amine gas atmosphere. Consequently, the following problem, for example, is undesirably caused with a time delay between exposure and post exposure bake: "T-shaped" profile takes place in pattern formation, the dimensions of a pattern are greatly changed, or pattern formation is utterly impossible. Thus, one of the features of the present invention is that the polymer used in the photoresist composition does not require an acid generator generating such a strong acid.

As the solvent used in this invention, any solvent may be used so long as it can dissolve both the polymer and the photoacid generator. Usually, there are preferably used solvents which cannot absorb light at about 230 to about 300 nm. Specific examples of the solvent are methyl Cellosolve acetate, ethyl Cellosolve acetate, propylene glycol monoethyl ether acetate, methyl lactate, ethyl lactate, 2-ethoxyethyl acetate, methyl pyruvate, ethyl pyruvate, methyl 3-methoxypropionate, ethyl 3-methoxypropionate, N-methyl-2-pyrrolidone, cyclohexanone, methyl ethyl ketone, 1,4-dioxane, ethylene glycol monoisopropyl ether, diethylene glycol monoethyl ether, diethylene glycol monomethyl ether, diethylene glycol dimethyl ether, etc. Needless to say, the solvent is not limited to them. Although the photoresist compositions of this invention usually comprise the above three components (the polymer (a), the photoacid generator (b) and the solvent (c)) as main constituents, they may, if necessary, contain dyes such as fluorenone derivatives, anthracene derivatives, or pyrene derivatives, surfactants or bleaching agents such as compounds having diazodiketo groups

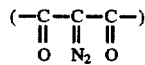

or diazoketo groups

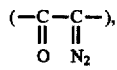

etc.

A pattern is formed by use of the photoresist composition of this invention, for example, as follows.

The photoresist composition comprising the compounds according to this invention is coated on a substrate such as silicon wafer to a thickness of approximately 0.5–2 μm (approximately 0.1 to 0.5 μm when used as a top layer among three layers), and pre-baked in an oven at 70° to 130° C. for 10 to 30 minutes, or on a hot plate at 70° to 130° C. for 1 to 2 minutes. Then, a mask for forming a desired pattern is put over the resist film thus formed, and the resist film is irradiated with deep ultraviolet light having a wavelength of 300 nm or less, at an exposure dose of approximately 1–100 mJ/cm², followed by baking at 70° to 150° C. for 1 to 2 minutes on a hot plate. Using a developing solution such as a 0.1 to 5% aqueous tetramethylammonium hydroxide (TMAH) solution, the resist film is developed for about 0.5 to about 3 minutes by a conventional method such as a dip method, a puddle method or a spray method to form the desired pattern on the substrate.

As to the blending proportions of the polymer and the photoacid generator according to this invention in a positive type resist material, the proportion of the photoacid generator is 0.01 to 0.3 part by weight, preferably 0.01 to 0.1 part by weight, per part by weight of the polymer. The amount of the solvent in the photo-resist composition of this invention is not critical so long as it does not cause trouble when a positive type resist material obtained by dissolving the polymer and the photoacid generator according to this invention in the solvent is coated on a substrate. The amount is usually 1 to 20 parts by weight, usually about 1.5 to about 6 parts by weight, per part by weight of the polymer.

As the developing solution used in the above various pattern formation methods, an alkali solution having a suitable concentration which dissolves the exposed portion but hardly dissolves the unexposed portion, is chosen depending on the solubility of the polymer used in the resist material in alkali developing solutions. The concentration is chosen usually in the range of 0.01 to 20%. As the alkali solution used, there can be exemplified solutions containing organic amines such as TMAH, choline, triethanolamine, etc., or inorganic alkalis such as NaOH, KOH, etc.

Since as described above, the polymer used in this invention comprises monomeric units of the formula [IX] having a functional group of the formula [VIII], it releases the functional group more easily in the presence of an acid to become alkali-soluble, as compared with conventional polymers used for the same purpose. Therefore, the polymer used in this invention permits stable maintenance of the dimensions of a pattern during a delay time between exposure and post exposure bake (PEB). Moreover, since the polymer used in this invention comprises hydroxystyrene units of the formula [X], it has high heat resistance, dry etching resistance and adhesive properties to a substrate. A polymer of the formula [I] or [II] wherein both $R^2$ and $R^3$ are hydrogen atoms (the monomeric unit of the formula [IX] is that derived from, for example, p-alkoxymethoxystyrene) cannot be used in this invention because when it is used, the photoresist composition acts as a negative resist material.

It was confirmed that in the photoresist compositions of this invention which comprise a photoacid generator of the formula [III], formula [IV], formula [VI] or formula [VII], an acid is generated not only by irradiation with KrF excimer laser beams but also by irradiation with electron beams or X-rays, and causes chemical amplification. Therefore, the photoresist compositions of this invention make it possible to form a pattern by irradiation with deep ultraviolet light, KrF excimer laser beams (248.4 nm), electron beams or X-rays at a low exposure dose by utilizing a chemical amplification method.

The action of this invention is explained below by giving specific examples. First, in a portion exposed to KrF excimer laser beams, deep ultraviolet light or the like, an acid is generated, for example, by a photo-reaction represented by the following Equation 1, Equation 2, Equation 3 or Equation 4:

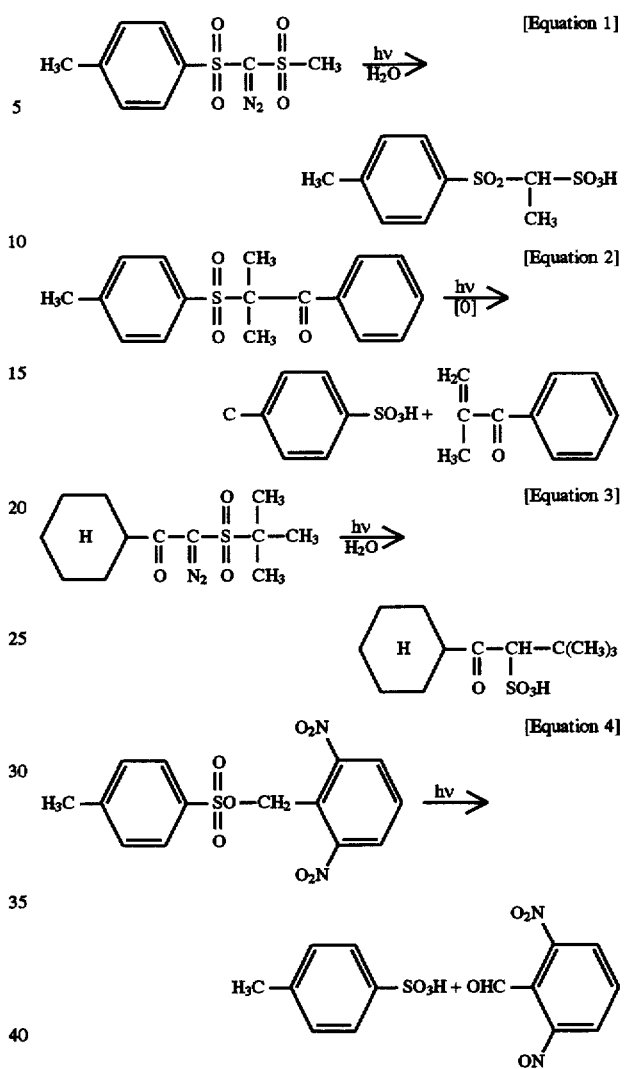

When heat treatment is carried out after the exposure, the specified functional group (for example, 1-ethoxyethoxy group as in the Equation 5 shown below) of the polymer used in this invention is chemically changed by the acid to become a hydroxyl group, according to the following reaction formula, the Equation 5, and the polymer thus made alkali-soluble is dissolved in a developing solution during development:

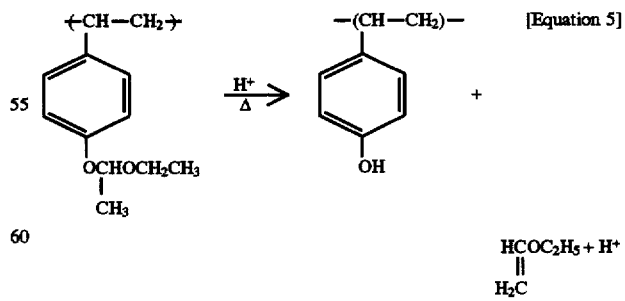

On the other hand, in the unexposed portion, no acid is generated, so that the heat treatment does not cause the chemical change. Moreover, the photoacid generator has the effect of protecting the hydrophilic group portion of the polymer used for improvement of the adhesive properties to a substrate, against infiltration with an alkali developing solution. Thus, when a pattern is formed using the photoresist composition of this invention, there is a large difference between the exposed portion and the unexposed portion in solubility in the alkali developing solution. Furthermore, since the polymer in the unexposed portion has a strong adhesion to a substrate, no film peeling is caused during the development. Consequently, a positive pattern having a satisfactory contrast is formed. Since the acid generated by the exposure acts catalytically as shown in the above Equation 5, it is sufficient that the exposure is carried out so as to generate a necessary amount of the acid. Therefore, it becomes possible to reduce the amount of exposure energy.

This invention is explained below in further detail with reference to Examples, Synthesis Examples and Comparative Examples, which are not by way of limitation but by way of illustration.

SYNTHESIS EXAMPLE 1

Synthesis of poly[p-(1-ethoxyethoxy)styrene/p-hydroxystyrene] [Method 1]

(1) Synthesis of p-bromo-(1-ethoxyethoxy)benzene p-Bromophenol (50 g, 0.29 mole), ethyl vinyl ether (41.7 g, 0.58 mole) and pyridinium p-toluene-sulfonate (1.5 g) were dissolved in methylene chloride (300 ml), followed by reaction with stirring at room temperature for 6 hours. Then 5% aqueous sodium bicarbonate (400 ml) was added to the reaction mixture, and stirred. Then, the organic layer was separated, washed with $H_2O$ (300 ml×3), dried over anhydrous $MgSO_4$ and evaporated. The residue (82 g) was distilled under reduced pressure to give 71.1 g of p-bromo-(1-ethoxy-ethoxy)benzene as a pale yellow oil having a boiling point of 112°–114° C./6 mmHg.

$^1$HNMR δ ppm ($CDCl_3$): 1.20 (3H, t, J=7 Hz, —$CH_2$–C$H_3$), 1.49 (3H, d, J=5.1 Hz, —OCH—C$H_3$), 3.47–3.83 (2H, m, —C$H_2$$CH_3$), 5.31–5.37 (1H, q, J=5.5 Hz, OC$H$CH$_3$), 6.95 (2H, d, J=8.8 Hz, Aromatic 2-H, 6-H), 7.32 (2H, d, J=8.8 Hz, Aromatic 3-H, 5-H).

IR(Neat) ν cm$^{-1}$: 2970, 2930, 2890, 1595, 1490.

(2) Synthesis of p-(1-ethoxyethoxy)styrene

To a suspension of magnesium turning (3.7 g, 0.15 atom) in dry tetrahydrofuran (30 ml) under nitrogen, a solution of p-bromo-(1-ethoxyethoxy)benzene (35 g, 0.14 mole) obtained in above (1) in dry tetrahydrofuran (150 ml) was added dropwise under mild reflux, followed by reaction with stirring for 1 hour under reflux.

After cooling to 10° C, dichloro{1,2-bis (diphenylphosphino)ethane}nickel (0.8 g) was added to the reaction mixture, then a solution of vinyl bromide (15.3 g, 0.14 mole) in dry tetrahydrofuran (50 ml) was added dropwise at 20°–30° C. under nitrogen and continued to stir at room temperature for 1 hour. To the reaction mixture, aqueous ammonium chloride (200 ml) and methylene chloride (200 ml) were added, followed by stirring. Then, the organic layer was separated, washed with $H_2O$ (200 ml×2), dried over anhydrous $MgSO_4$ and evaporated. The remaining oil (30 g) was purified by fractional distillation under reduced pressure in the presence of a few milligrams of tert-butylcatechol as an inhibitor. There was obtained 21.5 g of p-(1-ethoxyethoxy)styrene as a colorless oil having a boiling point of 93°–96° C./1 mmHg.

$^1$HNMR δ ppm ($CDCl_3$): 1.20 (3H, t, J=7Hz, —$CH_2$C$H_3$), 1.50 (3H, d, J=5.1 Hz, OCHC$H_3$), 3.49–3.85 (2H, m, —C$H_2$$CH_3$), 5.13 (1H, d, J=10.6 Hz, C$H_2$=CH—), 5.35–5.41 (1H, q, J=5.5 Hz, OC$H$CH$_3$), 5.62 (1H, q, J=17.6 Hz, C$H_2$=C$H$—), 6.66 (1H, dd, J=10.6 Hz and J=17.6 Hz, C$H_2$=C$H$—), 6.95 (2H, d, J=8.8 Hz, Aromatic 3-H, 5-H), 7.33 (2H, d, J=8.8 Hz, Aromatic 2-H, 6-H).

IR(Neat) ν cm$^{-1}$: 2970, 2930, 2890, 1635 (C=C), 1605, 1505.

Anal. calcd. for $C_{12}H_{16}O_2$: C %, 74.97; H %, 8.39. Found: C %, 75.08; H %, 8.33.

(3) Free radical polymerization of p-(1-ethoxyethoxy)styrene

A solution of p-(1-ethoxyethoxy) styrene (19.2 g) obtained in above (2) in toluene containing catalytic amount of 2,2'-azobisisobutyronitrile (AIBN) was polymerized at 80° C. for 6 hours under nitrogen. After cooling, the reaction mixture was poured into methanol (1 liter) with stirring, standed, and then decanted. The resultant viscous oil was washed twice with methanol (500 ml) and concentrated under reduced pressure to give 16.3 g of poly[p-(1-ethoxyethoxy)styrene] as a pale yellow viscous oil having Mw 10000 and Mn 5500 (GPC with polystyrene calibration).

(4) Synthesis of poly[p-(1-ethoxyethoxy)styrene/p-hydroxystyrene]

A solution of poly[p-(1-ethoxyethoxy)styrene] (15.5 g) obtained in above (3) and oxalic acid (1.6 g) in 1,4-dioxane (150 ml) was reflux for 3 hours with stirring. The mixture was cooled, poured into $H_2O$ (1 liter) and the solid was precipitated. The precipitate was filtered, washed with $H_2O$ and dried under reduced pressure to afford 12.0 g of the title compound as a white powder having Mw 8500, Mw/Mn≈ca. 1.8 (GPC with polystyrene calibration). The polymer was found to have p-(1-ethoxyethoxy)styrene unit and p-hydroxystyrene unit in a molar ratio of ca. 1:1 based on $^1$HNMR analysis (with calibration using the methine proton at δ 5.25–5.4 ppm and the aromatic proton at δ 6.2–6.8 ppm in the $^1$HNMR spectrum.)

SYNTHESIS EXAMPLE 2

Synthesis of poly[p-(1-ethoxy ethoxy)styrene/p-hydroxystyrene] [Method 2]

Using p-(1-ethoxyethoxy)styrene (9.6 g) obtained in Synthesis Example 1, (2) and p-hydroxystyrene (6.0 g), free radical polymerization was carried out in the same manner as described in Synthesis Example 1, (3). Then the reaction mixture was poured into petroleum ether (1 liter), and the precipitate was filtered, washed and dried in vacuo to afford 12.8 g of the title compound as a white powder having Mw 9000 and Mw/Mn=2.0 (GPC with polystyrene calibration). The polymer was found to have p-(1-ethoxyethoxy)styrene unit and p-hydroxystyrene unit in a molar ratio of ca. 1:1 based on $^1$HNMR.

SYNTHESIS EXAMPLE 3

Synthesis of poly[p-(1-ethoxy-ethoxy)styrene/p-hydroxystyrene] [Method 3]

(1) Free radical polymerization of p-tert-butoxystyrene

A solution of p-tert-butoxystyrene (17.6 g) in toluene containing catalytic amount of 2,2'-azobis-isobutyronitrile (AIBN) was polyemrizaed at 80° C. for 6 hours under nitrogen. After cooling, the reaction mixture was poured into methanol (1 liter) and the polymer was precipitated. The polymer was filtered, washed with methanol and dried under reduced pressure to afford 15.5 g of poly(p-tert-butoxystyrene) as a white powder having Mw 10000 (GPC with polystyrene calibration).

(2) Synthesis of poly(p-hydroxystyrene)

A solution of poly(p-tert-butoxystyrene) (15.0 g) obtained in above (1) and conc. hydrochloric acid (10 ml) in 1,4-dioxane was refluxed for 4 hours with stirring. The mixture was cooled, poured into $H_2O$ (1 liter) and the solid was precipitated. The polymer was filtered, washed with $H_2O$ and dried under reduced pressure to give 9.7 g of poly(p-hydroxystyrene) as a white powder.

(3) Synthesis of poly[p-(1-ethoxyethoxy)styrene/p-hydroxystyrene]

To a solution of poly(p-hydroxystyrene) (4.0 g) obtained in above (2) and ethyl vinyl ether (1.5 g) in a mixed solvent (35 ml) of pyridine and 1,4-dioxane, a catalytic amount of p-toluenesulfonic acid was added and reacted with stirring at room temperature for 24 hours. The reaction mixture was poured into $H_2O$ (1 liter) and a white solid was precipitated. The polymer was filtered, washed with $H_2O$ and dried under reduced pressure to afford 5.0 g of the desired product as a white powder having Mw 10000 (GPC with polystyrene calibration). The polymer was found to have p-(1-ethoxyethoxy)styrene unit and p-hydroxystyrene unit in a molar ratio of ca. 1:1 based on $^1$HNMR.

SYNTHESIS EXAMPLE 4

Synthesis of poly[p-(1-ethoxy ethoxy)styrene/p-hydroxystyrene][Method 4]

A solution of poly(p-hydroxystyrene) (8.0 g) [MARUKA LYNCUR-M, manufactured by Maruzene Petrochemical Co., Ltd., having Mw 10000 and Mn 5000], ethyl vinyl ether (3.0 g) and pyridinium p-toluenesulfonate (0.5 g) in dioxane (70 ml) was reacted with stirring at room temperature for 24 hours. After reaction, the mixture was poured into $H_2O$, was precipitated with stirring, and the precipitate was filtered, washed with $H_2O$ and then dried in vacuo. There was obtained 10.0 g of the desired product as a white powder having Mw 11000 (GPC with polystyrene calibration). The polymer was found to have p-(1-ethoxyethoxy)styrene unit and p-hydroxystyrene unit in a molar ratio of ca. 1:1 based on $^1$HNMR.

SYNTHESIS EXAMPLE 5

Synthesis of poly[p-(1-ethoxy-ethoxy)styrene/p-hydroxystyrene]

To a solution of poly(p-hydroxystyrene) (4.0 g) obtained in Synthesis Example 3, (2) and ethyl vinyl ether (1.5 g) in acetone, a catalytic amount of pyridinium p-toluenesulfonate was added, and reacted with stirring at room temperature for 12 hours. The reaction mixture was poured into $H_2O$ (1 liter) and was precipitated. The precipitate was filtered, washed with $H_2O$ and dried under reduced pressure to give 3.9 g of the desired product as a white powder having Mw 10000 (GPC with polystyrene calibration). The polymer was found to have p-(1-ethoxyethoxy)styrene unit and p-hydroxystyrene unit in a molar ratio of ca. 35:65 based on $^1$HNMR.

SYNTHESIS EXAMPLE 6

Synthesis of poly[p-(1-methoxy ethoxy)styrene/p-hydroxystyrene][Method 1]

(1) Synthesis of p-bromo-(1-methoxyethoxy)benzene

Using p-bromophenol (17.3 g, 0.1 mole) and methyl vinyl ether (14.0 g, 0.2 mole), the reaction was carried out in the same manner as described in Synthesis Example 1, (1), and the crude oil (24 g) was purified by distillation under reduced pressure to afford 20.8 g of p-bromo-(1-methoxyethoxy)benzene as a pale yellow oil having a boiling point 89°–90° C./2 mmHg.

$^1$HNMR δ ppm (CDCl$_3$): 1.46 (3H, d, J=5 Hz, OCHC$\underline{H}_3$), 3.37 (3H, s, —OCH$_3$), 5.29 (1H, q, J=5.5 Hz, O C$\underline{H}$CH$_3$), 6.86 (2H, d, J=8 Hz, Aromatic 2-H, 6-H), 7.36 (2H, d, J=8.8 Hz, Aromatic 3-H, 5-H).

IR(Neat) ν cm$^{-1}$: 3000, 2940, 2850, 1590, 1580, 1490.

(2) Synthesis of p-(1-methoxyethoxy)styrene

Using p-bromo-(1-methoxyethoxy)benzene (11.6 g) obtained in above (1), the reaction was carried out in the same manner as described in Synthesis Example 1, (2), and the crude oil (10.7 g) was distilled under reduced pressure in the presence of a few milligrams of p-tert-butylcatechol as an inhibitor to give 8.8 g of p-(1-methoxyethoxy)styrene as a colorless oil having a boiling point of 86°–87° C./3 mmHg.

$^1$HNMR δ ppm (CDCl$_3$): 1.46 (3H, d, J=5.5 Hz, OCHC$\underline{H}_3$), 3.37 (3H, s, C$\underline{H}_3$), 5.12 (1H, d, J=11 Hz, C$\underline{H}_2$=CH—), 5.30 (1H, q, J=5.1 Hz and J=5.5 Hz, O C$\underline{H}$CH$_3$), 5.60 (1H, d, J=17.6 Hz, C$\underline{H}_2$=CH—), 6.64 (1H, dd, J=11 Hz and J=17.6 Hz, C$\underline{H}_2$=C$\underline{H}$—), 6.95 (2H, d, J=8.8 Hz, Aromatic 3-H, 5-H), 7.32 (2H, d, J=8.8 Hz, Aromatic 2-H, 6-H).

IR(Neat) ν cm$^{-1}$: 2980, 2920, 2820, 1620 (C=O), 1600, 1500.

Anal. calcd. for $C_{11}H_{14}O_2$: C %, 74.13; H %, 7.92. Found: C %, 74.41; H %, 7.88.

(3) Free radical polymerization of p-(1-methoxyethoxy)styrene

Using p-(1-methoxyethoxy)styrene (8.0 g) obtained in above (2), the polymerization was carried out in the same manner as described in Synthesis Example 1, (3), and the resultant viscous oil was washed with methanol and concentrated in vacuo to give 7.2 g of poly(1-methoxyethoxy)styrene as a pale yellow viscous oil having Mw 10000 and Mn 5000 (GPC with polystyrene calibration).

(4) Synthesis of poly[p-(1-methoxyethoxy)styrene/p-hydroxystyrene]

Using poly(1-methoxyethoxy)styrene (6.2 g) obtained in above (3), the reaction was carried out in the same manner as described in Synthesis Example 1, (4) to afford 3.0 g of the title compound as a white powder having Mw 9000 and Mw/Mn≈1.8 (GPC with polystyrene calibration). The composition of the polymer was found to be p-(1-methoxyethoxy)styrene unit and p-hydroxystyrene unit in a molar ratio of ca. 45:55 based on $^1$HNMR.

SYNTHESIS EXAMPLE 7

Synthesis of poly[p-(1-methoxy-1-methylethoxy) styrene/p-hydroxy styrene]

To a solution of poly(p-hydroxystyrene) (4.0 g) obtained in the same manner as described in Synthesis Example 3, (2) and 2-methoxy-1-propene (4.8 g) in a mixed solvent (35 ml) of pyridine and 1,4-dioxane, a catalytic amount of chlorosulfonic acid was added and then reacted with stirring at room temperature for 20 hours. After reaction, the reaction was carried out in the same manner as described in Synthesis Example 2, (3) to give 4.1 g of poly[p-(1-methoxy-1-methylethoxy)styrene/p-hydroxystyrene as a white powder having Mw 10000 (GPC with polystyrene calibration). The composition of the polymer was found to be p-(1-methoxy-1-methylethoxy)styrene unit and p-hydroxystyrene unit in a molar ratio of ca. 1:1 based on $^1$HNMR.

SYNTHESIS EXAMPLE 8

Synthesis of poly[p-(1-n-butoxy ethoxy)styrene/p-hydroxystyrene]

To a solution of poly(p-hydroxystyrene) (4.8 g) obtained in the same manner as described in Synthesis Example 3, (2)

and n-butyl vinyl ether (3.0 g) in a mixed solvent (50 ml) of pyridine and 1,4-dioxane, a catalytic amount of conc. sulfuric acid was added, then continued to stir at room temperature for 16 hours. The reaction mixture was treated in the same manner as described in Synthesis Example 2, (3) to give 4.2 g of poly[p-(1-n-butoxyethoxy)styrene/p-hydroxystyrene] as a white powder having Mw 10000 (GPC with polystyrene calibration). The composition of the polymer was found to be p-(1-n-butoxyethoxy)styrene unit and p-hydroxystyrene unit in a molar ratio of 4:6 based on $^1$HNMR.

SYNTHESIS EXAMPLE 9

Synthesis of poly[p-(1-ethoxyethoxy)styrene/p-hydroxystyrene/fumaronitrile]

(1) Free radical polymerization of p-tert-butoxy-styrene and fumaronitrile

A solution of p-tert-butoxystyrene (28.2 g, 0.16 mole) and fumaronitrile (3.1 g, 0.04 mole) in toluene containing catalytic amount of 2,2'-azobis (methyl 2-methylpropionate) was heated at 90° C. for 2 hours under nitrogen. After reaction, the reaction mixture was poured into methanol to precipitate a polymer. The polymer was filtered, washed and dried in vacuo to give 21.3 g of poly(p-tert-butoxystyrene-fumaronitrile) as a white powder.

(2) Synthesis of poly(p-hydroxystyrene/fumaronitrile)

Using poly(p-tert-butoxystyrene/fumaronitrile) (20.0 g) obtained in above (1), the reaction was carried out in the same manner as described in Synthesis Example 3, (2) to afford 10.6 g of the desired product as a white powder having Mw 10000 (GPC with polystyrene calibration).

(3) Synthesis of poly[p-(1-ethoxyethoxy)styrene/p-hydroxystyrene/fumaronitrile]

Using poly(p-hydroxystyrene/fumaronitrile) (9.0 g) obtained in above (2) and ethyl vinyl ether (3.0 g), the reaction was carried out in the same manner as described in Synthesis Example 3, (3) to give 8.8 g of the desired product as a white powder having Mw 11000 (GPC with polystyrene calibration). The composition of the polymer was found to be p-(1-ethoxyethoxy)styrene unit and p-hydroxystyrene unit in a molar ratio of ca. 4:6 based on $^1$HNMR.

SYNTHESIS EXAMPLE 10

Synthesis of poly[p-(1-ethoxyethoxy)styrene/p-hydroxystyrene/tert-butyl methacrylate]

(1) Free radical polymerization of p-(1-ethoxyethoxy)styrene and tert-butyl methacrylate]

A solution of p-(1-ethoxyethoxy)styrene (17.3 g, 0.09 mole) obtained in Synthesis Example 1, (2) and tert-butyl methacrylate (1.4 g, 0.01 mole) in toluene containing catalytic amount of 2,2'-azobis(methyl 2,4-dimethylpropionate) was heated at 80° C. for 8 hours under nitrogen. After cooling, the reaction mixture was poured into petroleum ether with stirring, standed, and then decanted. The resultant viscous oil was washed twice with methanol (500 ml) and concentrated under reduced pressure to give 15.5 g of poly[p-(1-ethoxyethoxy)-styrene/tert-butyl methacrylate] as a pale yellow viscous oil having Mw 12000 (GPC with polystyrene calibration).

(2) Synthesis of poly[p-(1-ethoxyethoxy)styrene/p-hydroxystyrene/tert-butyl methacrylate]

A solution of poly[p-(1-ethoxyethoxy)styrene/tert-butyl methacrylate] (12.0 g) obtained in above (1) in 1,4-dioxane, was added with p-toluenesulfonic acid (0.5 g) and reacted with stirring at 80° C. for 30 minutes. After cooling, the reaction mixture was poured into $H_2O$ (1 liter) to precipitate a polymer. The polymer was filtered by suction, washed with $H_2O$ and dried in vacuo to give 9.8 g of the desired product as a white powder having Mw 11000 (GPC with polystyrene calibration). The composition of the polymer was found to be p-(1-ethoxyethoxy)styrene unit and p-hydroxystyrene unit in a molar ratio of ca. 35:65 based on $^1$HNMR analysis.

REFERENCE EXAMPLE 1

Synthesis of poly(p-tetrahydropyranylstyrene/p-hydroxystyrene)

To a solution of poly(p-hydroxystyrene) (9.0 g) [MARUKA LYNCUR-M, manufactured by Maruzen Petrochemical Co., Ltd., Mw 10000 and Mn 5000] in dimethoxyethane (100 ml), 3,4-dihydro-2H-pyran (12.6 g) and conc. sulfuric acid (0.5 ml) were added, followed by reaction at 30°–40° C. for 15 hours with stirring. After reaction, the mixture was evaporated in vacuo, the residue was neutralized by addition of sodium carbonate and poured into $H_2O$ (1 liter). The precipitate was filtered by suction, washed with $H_2O$ and dried under reduced pressure to give 11.0 g of the title compound as a white powder having Mw 10000 (GPC with polystyrene calibration). The composition of the polymer was found to be p-tetrahydro-pyranyloxystyrene unit and p-hydroxystyrene unit in a molar ratio of ca. 3:7 based on $^1$HNMR.

REFERENCE EXAMPLE 2

Synthesis of poly(p-tert-butoxystyrene/p-hydroxystyrene)

To a solution of poly(p-hydroxystyrene) (4.0 g) [MARUKA LYNCUR-M, manufactured by Maruzen Petrochemical Co., Ltd., Mw 10000 and Mn 5000] in dimethoxyethane (70 ml) in a pressure vessel, isobutyrene (60 g) and conc. sulfuric acid (0.3 g) were added at –60° C. or lower. The mixture was brought to 45° C. for 1 hour with stirring, and then stirring was continued at room temperature for 22 hours. After reaction, the mixture was evaporated, and the residue was neutralized by sodium carbonate and poured into $H_2O$. The precipitate was filtered by suction, washed was $H_2O$ and dried in vacuo to give 4.1 g of poly(p-tert-butoxystyrene/p-hydroxystyrene) as a white powder having Mw 10000 (GPC with polystyrene calibration). $^1$HNMR analysis indicated that 50% of p-hydroxy group was converted into p-tert-butoxy group.

REFERENCE EXAMPLE 3

Synthesis of poly(p-tert-butoxycarbonyloxystyrene/p-hydroxy-styrene)

(1) A solution of p-tert-butoxycarbonyloxystyrene (22 g, 0.1 mole) obtained by the method of U.S. Pat. No. 4,491,628 (1985) in toluene containing catalytic amount of 2,2'-azobis (2,4-dimethylvaleronitrile) was heated at 90° C. for 4 hours under nitrogen. After cooling, the reaction mixture was poured into methanol and polymer was precipitated. The polymer was filtered, washed with methanol and dried under reduced pressure to give 15.2 g of poly(p-tert-butoxycarbonyloxystyrene) as a white powder having Mw 12000 (GPC with polystyrene calibration).

(2) To a solution of poly(p-tert-butoxycarbonyloxystyrene) (7.0 g) obtained in above (1) in 1,4-dioxane, conc. hydrochloric acid (5 ml) was added and continued to stir under reflux for 1.5 hours. After cooling, the reaction mixture was poured into H$_2$O (1 liter) and the polymer was precipitated. The polymer was filtered by suction, washed with H$_2$O and dried in vacuo to afford 4.8 g of poly(p-tert-butoxycarbonyloxy-styrene/p-hydroxystyrene) as a white powder having Mw 9500 (GPC with polystyrene calibration). The composition of the polymer was found to be p-tert-butoxycarbonyloxy-styrene unit and p-hydroxystyrene unit in a molar ratio of ca. 1:1 based on $^1$HNMR analysis.

REFERENCE EXAMPLE 4

Synthesis of 2-cyclocarbonyl-2-(p-toluenesulfonyl)propane (1) To a suspension of magnesium turning (23.9 g, 0.98 atom) in dry ethyl ether, cyclohexylbromide (160 g, 0.98 mole) was added dropwise under mild reflux, followed by reaction with stirring for 1 hour under reflux to afford Grignard reagent. After cooling, the Grignard reagent was added dropwise to a solution of isobutyloyl chloride (95 g, 0.89 mole) in dry ethyl ether at −5°–0° C., the resultant mixture was stirred at the same temperature for 3 hours and standed at room temperature overnight. The reaction mixture was poured into H$_2$O, and the organic layer was separated, washed with H$_2$O, dried over anhydrous MgSO$_4$ and evaporated. The residue was distilled under reduced pressure to give 50 g of 1-cyclohexyl-2-methyl-1-propanone as a pale yellow oil having a boiling point of 95°–100° C./20 mmHg.

$^1$HNMR δ ppm (CDCl$_3$): 1.06 (6H, d, C$\underline{H}_3$×2), 1.12–1.87 (10H, m, cyclohexylic C$\underline{H}_2$×5), 2.51 (1H, m, cyclohexylic C$\underline{H}$), 2.76 (1H, m, C$\underline{H}$)

IR(Neat) ν cm$^{-1}$: 1710 (C=O).

(2) To 1-cyclohexyl-2-methyl-1-propanone (47.6 g, 0.31 mole) obtained in above (1), sulfuryl chloride (42 g, 0.31 mole) was added dropwise at 25°–35° C. The mixture was stirred at 50° C. for 3.5 hours and then evaporated. The resultant residue was distilled under reduced pressure to give 30.1 g of 2-chloro-1-cyclohexyl-2-methyl-1-propanone as a yellow oil having a boiling point of 99°–105° C./18 mmHg.

$^1$HNMR δ ppm(CDCl$_3$): 1.18–1.87 (16H, m, C$\underline{H}_3$×2 and cyclohexylic C$\underline{H}_2$×5), 3.13 (1H, m, cyclohexylic C$\underline{H}$).

(3) A solution of 2-chloro-1-cyclohexyl-2-methyl-1-propanone (30.3 g, 0.16 mole) obtained in above (2) and sodium p-toluenesulfinate (30.0 g, 0.17 mole) in dimethylsulfoxide (320 ml) was reacted with stirring at 60° C. for 20 hours. The reaction mixture was poured into cold H$_2$O, continued to stir at 0°–5° C. for 1 hour. The precipitate was filtered, washed with H$_2$O and dried. The crude solid (18 g) was recrystallized from n-hexane/benzene to give 13.5 g of 2-cyclohexylcarbonyl-2-(p-toluenesulfonyl)propane as white needles, m.p. 123°–123.5° C.

$^1$HNMR δ ppm (CDCl$_3$): 1.19–1.91 (16H, m, C$\underline{H}_3$×2 and cyclohexylic C$\underline{H}_2$×5), 2.45 (3H, s, Ph-C$\underline{H}_3$), 3.25 (1H, m, cyclohexylic C$\underline{H}$), 7.33 (2H, d, J=8 Hz, Aromatic 3-H, 5-H), 7.65 (2H, d, J=8 Hz, Aromatic 2-H, 6-H).

IR(KBr-disk) ν cm$^{-1}$: 1705 (C=O), 1310

REFERENCE EXAMPLE 5

Synthesis of 2-methyl-2-(p-toluenesulfonyl)propiophenone

Using isobutyrophenone (29.6 g, 0.2 mole), the reaction was carried out in the same manner as described in Reference Example 4, (2) and (3). The crude solid was recrystallized from methanol to afford 21.2 g of 2-methyl-2-(p-toluenesulfonyl)propiophenone as white needles having a melting point of 64°–64.5° C.

$^1$HNMR δ ppm (CDCl$_3$): 1.70 (6H, s, C$\underline{H}_3$×2), 2.45 (3H, s, Ph-C$\underline{H}_3$), 7.32 (2H, d, J=7 Hz, p-Tolyl 3-H, 5-H), 7.44 (2H, t, J=7 Hz, Aromatic 3-H, 5-H), 7.54 (1H, t, J=7 Hz, Aromatic 4-H), 7.67 (2H, d, J=7 Hz, p-Tolyl 2-H, 6-H), 7.95 (2H, d, J=8 Hz, Aromatic 2-H, 6-H).

IR(KBr-disk) ν cm$^{-1}$: 1680 (C=O), 1303, 1290.

REFERENCE EXAMPLE 6

Synthesis of 2,4-dimethyl-2-(p-toluenesulfonyl)pentan-3-one

Using diisopropylketone (22.8 g, 0.2 mole), the reaction was carried out in the same manner as described in Reference Example 4, (2) and (3). The crude solid was recrystallized from n-hexane/benzene to afford 16.5 g of 2,4-dimethyl-2-(p-toluenesulfonyl)pentan-3-one as white leaflets, m.p. 76°–79° C.

$^1$HNMR δ ppm (CDCl$_3$): 1.15 (6H, d, C$\underline{H}_3$×2), 1.55 (6H, s, C$\underline{H}_3$×2), 2.45 (3H, s, Ph-C$\underline{H}_3$), 3.54 (1H, m, J=7 Hz, C$\underline{H}$), 7.34 (2H, d, J=8 Hz, Aromatic 3-H, 5-H), 7.65 (2H, d, J=8 Hz, Aromatic 2-H, 6-H).

REFERENCE EXAMPLE 7

Synthesis of bis(cyclohexylsulfonyl)diazomethane (1) After dissolving sodium azide (22.5 g, 0.35 mole) in a small amount of H$_2$O, the resulting solution was diluted with a 90% ethanol aqueous solution (130 ml). To this, a solution of p-toluenesulfonyl chloride (60 g, 0.32 mole) in ethanol (300 ml) was added dropwise at 10°–25° C., followed by reaction at room temperature for 2.5 hours. The reaction solution was concentrated at room temperature under reduced pressure. The resulting oily residue was washed several times with H$_2$O and dried over anhydrous MgSO$_4$. After removing the drying agent by filtration, there was obtained 50.7 g of p-toluene-sulfonylazide as a colorless oil.

$^1$HNMR δ ppm (CDCl$_3$): 2.43 (3H, s, C$\underline{H}_3$), 7.24 (2H, d, J=8 Hz, Aromatic 3-H, 5-H), 7.67 (2H, d, J=8 Hz, Aromatic 2-H, 6-H).

IR(Neat) ν cm$^{-1}$: 2120 (-N$_3$).

(2) To cyclohexylthiol (20.2 g, 0.17 mole), a solution of potassium hydroxide (12.0 g, 0.21 mole) in ethanol (50 ml) was added dropwise at room temperature and mixture was stirred at 30°±5° C. for 30 minutes. Then methylene chloride (18.2 g, 2.14 mole) was added to this mixture and reacted with stirring at 50°±5° C. for 6 hours. After standing at room temperature overnight, the reaction mixture was diluted with ethanol (55 ml) and added with sodium tungstate (0.4 g). Then, 30% hydrogen peroxide (50 g, 0.44 mole) was added dropwise to this solution at 45°–50° C., then reacted with stirring for 4 hours at the same temperature, added with H$_2$O (200 ml) and standed at room temperature overnight. The precipitate was filtered, washed with H$_2$O and dried. The resultant solid (22 g) was recrystallized from ethanol to give 15.5 g of bis(cyclohexylsulfonyl)methane as white needles, m.p. 137°–139° C.

$^1$HNMR δ ppm (CDCl$_3$): 1.13–2.24 (20H, m, cyclohexylic C$\underline{H}_2$×10), 3.52–3.66 (2H, m, cyclohexylic C$\underline{H}$×2), 4.39 (2H, s, C$\underline{H}_2$).

IR(KBr-disk) ν cm$^{-1}$: 1320, 1305.

(3) To a solution of sodium hydroxide (1.7 g) in a 60% ethanol aqueous solution (70 ml), bis(cyclohexyl-sulfonyl) methane (12.1 g, 0.04 mole) obtained in above (2) was added, then a solution of p-toluenesulfonylazide (8.2 g, 0.04 mole) obtained in above (1) in ethanol (10 ml) was added dropwise at 5°–10° C., followed by the reaction at room temperature for 7 hours. After standing at room temperature overnight, the precipitate was filtered, washed with ethanol and dried. The resultant residue (11 g) was recrystallized from acetonitrile to give 8.0 g of bis(cyclohexylsulfonyl) diazomethane as a pale yellow prisms having a melting point of 130°–131° C.

$^1$HNMR δ ppm (CDCl$_3$): 1.13–2.25 (20H, m, cyclohexylic C$\underline{H}_2$×10), 3.36–3.52 (2H, m, cyclohexylic C$\underline{H}$×2).

IR(KBr-disk) ν cm$^{-1}$: 2130 (CN$_2$), 1340, 1320.

REFERENCE EXAMPLE 8

Synthesis of methylsuflonyl p-toluenesulfonyldiazomethane (1) To a solution of methylthiomethyl p-tolyl-sulfone (6.0 g, 0.03 mole) and sodium tungstate (60 mg) in methanol (40 ml) and H$_2$O (40 ml), 30% hydrogen peroxide (6.8 g, 0.06 mole) was added dropwise at 45°–50° C., reacted with stirring for 10 hours under reflux, and standed at room temperature overnight. The reaction mixture was poured into H$_2$O (400 ml), and the precipitate was filtered, washed with H$_2$O and dried. The crude solid (7.2 g) was recrystallized from ethanol to afford 6.1 g of methylsulfonyl p-toluenesulfonylmethane as white needles, m.p. 163.5°–165° C.

$^1$HNMR δ ppm (CDCl$_3$): 2.48 (3H, s, Ph-C$\underline{H}_3$), 3.28 (3H, s, C$\underline{H}_3$), 4.56 (2H, s, C$\underline{H}_2$), 7.40 (2H, d, J=8 Hz, Aromatic 3-H, 5-H), 7.87 (2H, d, J=8 Hz, Aromatic 2-H, 6-H).

(2) Using methylsulfonyl p-toluenesulfonylmethane (5.0 g, 0.02 mole) obtained in above (1), the reaction was carried out in the same manner as described in Reference Example 7, (3). The crude solid (3 g) was recrystallized from ethanol to give 2.2 g of methyl-sulfonyl p-toluenesulfonyldiazomethane as pale yellow leaflets having a melting point of 107.5°–109° C.

$^1$HNMR δ ppm (CDCl$_3$): 2.46 (3H, s, Ph-C$\underline{H}_3$), 3.42 (3H, s, C$\underline{H}_3$), 7.38 (2H, d, J=8 Hz, Aromatic 3-H, 5-H), 7.87 (2H, d, J=8 Hz, Aromatic 2-H, 6-H).

IR(KBr-disk) ν cm$^{-1}$: 2120 (CN$_2$), 1350, 1330.

REFERENCE EXAMPLE 9

Synthesis bis(1,1-dimethylethyl-sulfonyl) diazomethane

Using tert-butylmercaptan (18.0 g, 0.2 mole), the reaction and treatment were carried out in the same manner as described in Reference Example 7, (2) and (3). The crude solid was recrystallized from ethanol to give 8.5 g of bis(1,1-dimethylethyl sulfonyl)diazomethane as pale yellow needles, m.p. 121°–121.5° C.

$^1$HNMR δ ppm (CDCl$_3$): 1.52 (18H, s, C$\underline{H}_3$×6).

IR(KBr-disk) ν cm$^{-1}$: 2120 (CN$_2$), 1330, 1315.

REFERENCE EXAMPLE 10

Synthesis of 1-diazo-1-cyclohexyl sulfonyl-3,3-dimethyl-2-butanone (1) To cyclohexylthiol (23 g, 0.198 mole), a solution of potassium hydroxide (13.7 g, 0.207 mole) in ethanol (80 ml) was added dropwise at 15° C., followed by stirring at the same temperature for 24 hours. After 1-bromo-3,3-dimethyl-2-butanone (35.4 g, 0.198 mole) was added dropwise to the reaction mixture at 10°–15° C. and continued to stir at 20° C. for 5 hours, sodium tungstate (2.5 g) was added. Then, 30% hydrogen peroxide (220 g, 1.96 mole) was added dropwise at 45°–50° C. and reacted with stirring at 60°–80° C. for 30 hours. After cooling, the reaction mixture was extracted with methylene chloride (300 ml×1), the organic layer was separated, dried over anhydrous MgSO$_4$ and evaporated to obtain 14 g of residual crude 1-cyclohexylsulfonyl-3,3-dimethyl-2-butanone as a pale yellow oil.

$^1$HNMR δ ppm (CDCl$_3$): 1.10–2.19 (19H, m, C$\underline{H}_3$×3 and cyclohexylic C$\underline{H}_2$×5), 3.37–3.53 (1H, m, cyclohexylic C$\underline{H}$), 4.12 (2H, s, C$\underline{H}_2$).

IR(Neat) ν cm$^{-1}$: 1700 (C=O), 1310.

(2) To a solution of crude 1-cyclohexylsulfonyl-3,3-dimethyl-2-butanone (13 g, 0.053 mole) obtained in above (1) and triethylamine (6.14 g, 0.061 mole) in ethanol (40 ml), p-toluenesulfonylazide (11.4 g, 0.058 mole) obtained in Reference Example 7, (1) was added dropwise at 0°–5° C., and continued to stir at 10°–20° C. for 8 hours. After standing at room temperature overnight, the reaction mixture was evaporated in vacuo. The residue was diluted with ethyl ether (250 ml), and the organic layer was washed with 5% potassium hydroxide aqueous solution (100 ml×2) and then brine (100 ml×1), dried over anhydrous MgSO$_4$ and evaporated. The residue (15 g) was chromatographed on silica gel (Wakogel C-200, manufactured by Wako Pure Chemical Industries, Ltd.) with n-hexane/methylene chloride (7/1→4/1→2/1) as eluent and recrystallized from n-hexane/ethyl ether to give 2.5 g of 1-diazo-1-cyclohexylsulfonyl-3,3-dimethyl-2-butanone as pale yellow needles, m.p. 80.5°–82.0° C.

$^1$HNMR δ ppm (CDCl$_3$): 1.05–2.16 (19H, m, C$\underline{H}_3$×3 and cyclohexylic C$\underline{H}_2$×5), 3.52–3.66 (1H, m, cyclohexylic C$\underline{H}$)

IR(KBr-disk) ν cm$^{-1}$: 2105 (CN$_2$), 1650 (C=O), 1320 (SO$_2$).

REFERENCE EXAMPLE 11

Synthesis of 1-diazo-1-methyl-sulfonyl-4-phenyl-2-butanone (1) A solution of 3-phenylpropionic acid (50 g, 0.33 mole) and conc. sulfuric acid (5 g) in methanol (220 ml) was refluxed for 1 hour with stirring, concentrated and poured into cold H$_2$O. The mixture was extracted thrice with methylene chloride (75 ml), the organic layer was washed thrice with H$_2$O (125 ml), dried over anhydrous MgSO$_4$ and evaporated. The residual crude oil (54 g) was distilled under reduced pressure to give 51.5 g of methyl 3-phenylpropionate as a colorless oil having a boiling point of 94°–95° C./5 mmHg.

IR(Neat) ν cm$^{-1}$: 1745 (CO$_2$).

(2) To a solution of dimethylsulfone (42 g, 0.45 mole) in dimethylsulfoxide (225 ml), 60% sodium hydride (17.9 g, 0.45 mole) was added in a small portion at 18°–20° C., stirring was continued at 65°–70° C. for 30 minutes, and then diluted with tetrahydrofuran (225 ml). Then to this mixture, a solution of methyl 3-phenylpropionate (36.6 g, 0.22 mole) obtained in above (1) in tetrahydro-furan (110 ml) was added dropwise at 33°–41° C., and reacted with stirring for 1 hour. After cooling, the reaction mixture was poured into diluted hydrochloric acid, and extracted 5 times with chloroform (100 ml). The organic layer was washed thrice with H$_2$O (200 ml), saturated aqueous sodium bicarbonate (200 ml), then H$_2$O (200 ml), dried over anhydrous MgSO$_4$ and evaporated. The crude solid (60.8 g) was recrystallized from ethyl acetate to afford 24.7 g of 1-methylsulfonyl-4-phenylbutan-2-one as white needles having a melting point of 97.6–°98.4° C.

$^1$HNMR δ ppm (CDCl$_3$): 2.91–3.09 (7H, m, C$\underline{H}_2$×2 and C$\underline{H}_3$), 3.99 (2H, s, C$\underline{H}_2$), 7.16–7.33 (5H, m, Aromatic).

IR(KBr-disk) ν cm$^{-1}$: 1730 ((C=O), 1320, 1305.

(3) To a solution of 1-methylsulfonyl-4-phenyl-butan-2-one (12 g, 0.05 mole) obtained in above (2) in methylene chloride (135 ml), triethylamine (11.5 g) was added dropwise, and stirring was continued for 30 minutes. To this solution, p-toluenesulfonyl azide (11.5 g, 0.06 mole) obtained in Reference Example 7, (1) was added dropwise at 0°–5° C., followed by reaction at the same temperature for 5 hours and the solvent was removed. The residual solid (26.6 g) was recrystallized from carbon tetrachloride to give 7.5 g of 1-diazo-1-methyl-sulfonyl-4-phenyl-2-butanone as pale yellow needles having a melting point of 52.5°–54° C.

$^1$HNMR δ ppm (CDCl$_3$): 2.88–3.07 (4H, m, C$\underline{H}_2$×2), 3.17 (3H, s, C$\underline{H}_3$), 7.16–7.35 (5H, m, Aromatic).

IR(KBr-disk) ν cm$^{-1}$: 2120 (CN$_2$), 1655 (C=O), 1335, 1315.

REFERENCE EXAMPLE 12

Synthesis of 1-diazo-1-(p-toluenesulfonyl)-3,3-dimethyl-2-butanone (1) To a solution of 1-bromo-3,3-dimethyl-2-butanone (33.3 g, 0.19 mole) in dimethylsulfoxide (330 ml), sodium p-toluenesulfinate (34.9 g, 0.20 mole) was added at 30°–40° C., and reacted with stirring at 60°–70° C. for 18 hours. The reaction mixture was poured into cold H$_2$O (2 liter). The precipitate was filtered, washed with H$_2$O and dried to afford 41.6 g of 1-(p-toluene-sulfonyl)-3,3-dimethyl-2-butanone as white crystals. m.p. 119°–122° C.

$^1$HNMR δ ppm (CDCl$_3$): 1.12 (9H, s, C$\underline{H}_3$×3), 2.45 (3H, s, C$\underline{H}_3$), 4.31 (2H, s, C$\underline{H}_2$), 7.36 (2H, d, J=8 Hz, Aromatic 3-H, 5-H), 7.82 (2H, d, J=8 Hz, Aromatic 2-H, 6-H).

IR(KBr-disk) ν cm$^{-1}$: 1715 (C=O), 1320, 1290.

(2) Using 1-(p-toluenesulfonyl)-3,3-dimethyl-2-butanone (20 g, 0.08 mole) obtained in above (1), the reaction and treatment were carried out in the same manner as described in Reference Example 7, (3). The resultant crude solid (24 g) was recrystallized from ethanol to give 12.6 g of 1-diazo-1-(p-toluenesulfonyl)-3,3-dimethyl-2-butanone as pale yellow microneedles, m.p. 120.5°–121.5° C.

$^1$HNMR δ ppm (CDCl$_3$): 1.17 (9H, s, C$\underline{H}_3$×3), 2.44 (3H, s, C$\underline{H}_3$), 7.34 (2H, d, J=8 Hz, Aromatic 3-H, 5-H), 7.93 (2H, d, J=8 Hz, Aromatic 2-H, 6-H).

REFERENCE EXAMPLE 13

Synthesis of 1-acetyl-1-(1-methylethylsulfonyl) diazomethane (1) To 2-propanethiol (12.2 g, 0.16 mole), a solution of potassium hydroxide (11.5 g, 0.174 mole) in ethanol (100 ml) was added dropwise at 15° C. or lower, and continued to stir at the same temperature for 24 hours. Then chloroacetone (23.1 g, 0.25 mole) was added dropwise at 10°–15° C., and reacted with stirring at 20° C. for 4 hours. To this mixture, sodium tungstate (0.8 g) was added, 30% hydrogen peroxide (36 g, 0.32 mole) was added dropwise at 45°–55° C., and reacted with stirring at room temperature for 14 hours. The reaction mixture was extracted with methylene chloride (200 ml). The organic layer was washed with H$_2$O, dried over anhydrous MgSO$_4$ and evaporated to give 18.9 g of residual crude 1-(1-methylethylsulfonyl) acetone as a brownish yellow oil.

$^1$HNMR δ ppm (CDCl$_3$): 1.40 (6H, d, J=7 Hz, C$\underline{H}_3$×2),2.40 (3H, s, C$\underline{H}_3$), 3.30 (1H, m, C$\underline{H}$), 4.00 (2H, s, C$\underline{H}_2$).

IR(Neat) ν cm$^{-1}$: 1310, 1110.

(2) To a solution of crude 1-(1-methylethyl-sulfonyl) acetone (8.65 g, 0.053 mole) obtained in above (1) and triethylamine (6.14 g, 0.061 mole) in ethanol (40 ml), p-toluenesulfonylazide (11.4 g, 0.058 mole) obtained in Reference Example 7, (1) was added dropwise at 0°–5° C., followed by reaction at 10°–20° C. for 5 hours. After standing at room temperature overnight, the solvent was removed. The residue was diluted with methylene chloride (200 ml). The organic layer was washed with 5% potassium hydroxide aqueous solution (200 ml×1) and H$_2$O (200 ml×3), and then evaporated. The residue (12.4 g) was chromatographed on silica gel (Wakogel C-200, manufactured by Wako Pure Chemical Industries, Ltd.) with n-hexane/methylene chloride (4/1→1/1) as eluent, and then was recrystallized from n-hexane/ethanol to give 2.6 g of 1-acetyl-1-(1-methylethylsulfonyl)diazomethane as pale yellow microneedles having a melting point of 53.0°–55.0° C.

$^1$HNMR δ ppm (CDCl$_3$): 1.44 (6H, d, J=7 Hz, C$\underline{H}_3$×2), 2.39 (3H, m, C$\underline{H}_3$), 3.51 (1H, m, C$\underline{H}$).

IR(KBr-disk) ν cm$^{-1}$: 2140 (CN$_2$), 1330 (SO$_2$), 1140.

REFERENCE EXAMPLE 14

Synthesis of 2,6-dinitrobenzyl p-toluenesulfonate (1) To a suspension of 2,6-dinitrobenzaldehyde (19.6 g, 0.1 mole) in methanol (200 ml), sodium boro-hydride (5.8 g) was added in a small portion at 15°–25° C. The resultant mixture was stirred at room temperature for 1 hour and then concentrated. To the residue, H$_2$O (100 ml) and chloroform (100 ml) were added, followed by stirring for 1 hour. The chloroform layer was separated, washed with H$_2$O, dried over anhydrous MgSO$_4$ and evaporated to afford 15.0 g of 2,6-dinitrobenzyl alcohol as yellow crystals, m.p. 92.5°–93.5° C.

$^1$HNMR δ ppm (CDCl$_3$): 2.77 (1H, t, J=7 Hz, O$\underline{H}$), 4.97 (2H, d, J=7 Hz, C$\underline{H}_2$), 7.66 (1H, t, J=8 Hz, Aromatic 4-H), 8.08 (2H, t, J=8 Hz, Aromatic 3-H, 5-H).

(2) To a solution of 2,6-dinitrobenzyl alcohol (14.9 g, 0.075 mole) obtained in above (1) and p-toluenesulfonyl chloride (15.7 g, 0.083 mole) in acetone (150 ml), a solution of dicyclohexylamine (15 g) in acetone (25 ml) was added dropwise at 0°–10° C., and stirring was continued for 4 hours at room temperature. The precipitate was filtered off and the filtrate was evaporated. The residue (29 g) was recrystallized from carbon tetracloride to give 19.8 g of 2,6-dinitrobenzyl p-toluenesulfonate as pale yellow leaflets having a melting point of 98°–99° C.

$^1$HNMR δ (CDCl$_3$): 2.45 (3H, s, C$\underline{H}_3$), 5.57 (2H, s, C$\underline{H}_2$), 7.34 (2H, d, J=8 Hz, p-Tolyl 3-H, 5-H), 7.68 (1H, t, J=8 Hz, 2,6-dinitrophenyl 4-H), 7.72 (2H, d, J=8 Hz, p-Tolyl 2-H, 6-H), 8.06 (2H, d, J=8 Hz, 2,6-dinitrophenyl 3-H, 5-H).

IR(KBr-disk) ν cm$^{-1}$: 1360, 1170.

REFERENCE EXAMPLE 15

Synthesis of cyclohexyl 1-diazo-2-benzenesulfonylacetate (1) To a solution of cyclohexyl bromoacetate (15.6 g, 0.0705 mole) in dimethylsulfoxide (120 ml), sodium benzenesulfinate dihydrate (15 g, 0.075 mole) was added in a small portion at 20°–40° C., and reacted with stirring at 60° C. for 6 hours. After cooling, the reaction mixture was poured into cold $H_2O$ (1.5 liter). The precipitate was filtered, washed with $H_2O$ and dried to give 15.3 g of cyclohexyl benzenesulfonylacetate as a white crystals having a melting point of 35°–38° C.

$^1$HNMR δ ppm ($CDCl_3$): 1.11–1.82 (10H, m, cyclohexylic $CH_2 \times 5$), 4.11 (2H, s, $CH_2$), 4.64–4.82 (1H, m, $CH$), 7.50–7.98 (5H, m, Aromatic).

IR(KBr-disk) ν $cm^{-1}$: 1735 (C=O), 1325 ($SO_2$), 1295.

(2) To a solution of cyclohexyl benzenesulfonyl-acetate (10 g, 0.035 mole) obtained in above (1) in methylene chloride (100 ml), triethylamine (4.2 g, 0.041 mole) was added dropwise and continued to stir for 30 minutes. To this mixture, p-toluenesulfonylazide (8.3 g, 0.039 mole) obtained in Reference Example 7, (1) was added dropwise at 0°–5° C., reacted with stirring at the same temperature for 4 hours and concentrated. The residue was diluted with ethyl ether (250 ml). The organic layer was washed with 5% potassium aqueous solution (200 ml×1) and brine (100 ml×1), dried over anhydrous $MgSO_4$ and evaporated. The residue (11 g) was purified by column chromatography on silica gel (Wakogel C-200) with n-hexane/methylene chloride (6/1→4/1→2/1→1/1) as eluent to give 5.6 g of cyclohexyl 2-diazo-2-benzenesulfonyl acetate as pale yellow crystals having a melting point of 42.0°–45.0° C.

$^1$HNMR δ ppm ($CDCl_3$): 1.11–1.87 (10H, m, cyclohexylic $CH_2 \times 5$), 4.02–4.90 (1H, m, cyclohexylic $CH$), 7.47–8.07 (5H, m, Aromatic).

IR(Neat) ν $cm^{-1}$: 2160 ($CN_2$), 1730 (C=O), 1365 ($SO_2$), 1310.

EXAMPLE 1

Each of the poly[p-(1-ethoxyethyoxy)styrene/p-hydroxystyrene]s obtained in Synthesis Example 1 and Synthesis Example 4 was made into a solution having the following composition:

Poly[p-(1-ethoxyethoxy)styrene/p-hydroxystyrene]3.0 g
Diethylene glycol dimethyl ether 7.0g Each of the compositions thus obtained was spin-coated on a substrate (a quartz wafer) and pre-baked on a hot plate at 90° C. for 90 seconds to obtain a polymer film of 1 μm in thickness. Then, each of the polymer films thus obtained was subjected to UV measurement. Their UV spectra are shown in FIG. 1. In FIG. 1, I shows an ultraviolet spectrophotometric curve of the polymer film obtained by use of the polymer obtained in Synthesis Example 1, and II shows an ultraviolet spectrophotometric curve of the polymer film obtained by use of the polymer obtained in Synthesis Example 4. From the results shown in FIG. 1, it can be seen that the polymer obtained in Synthesis Example 1 is superior (more transparent) to the polymer obtained in Synthesis Example 4 in light-transmitting properties particularly at approximately 240–250 nm which is the same as or near the wavelength of KrF excimer laser beams.

EXAMPLE 2

Figure 2A:
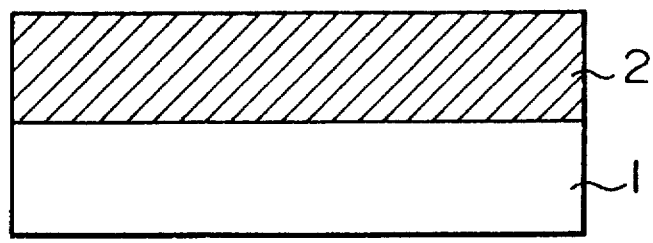
FIG. 2 is a flow diagram of a process for forming a positive pattern by use of the photoresist composition of this invention.
Figure 2B:
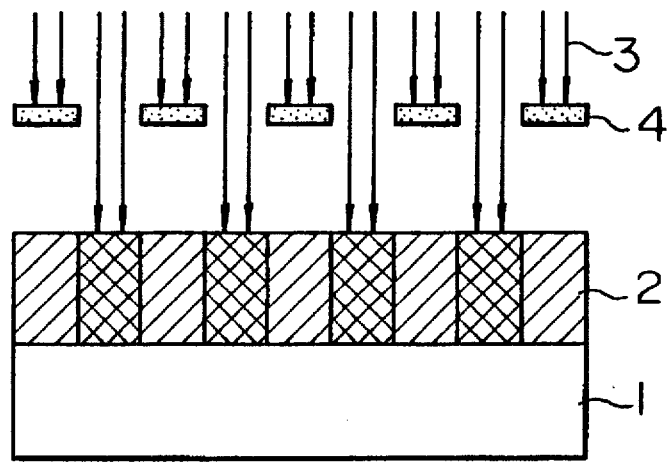
Figure 2C:
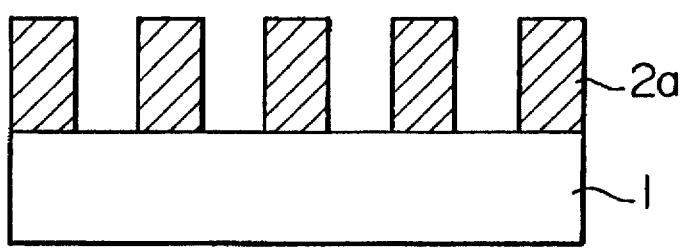

A photoresist composition was prepared according to the following recipe and a pattern was formed in the manner described below:

Poly[p-(1-ethoxyethoxy)styrene/p-hydroxystyrene] (the polymer of Synthesis Example 1) 6.0 g 2-(Cyclohexylcarbonyl)-2-(p-toluenesulfonyl)propane (the photoacid generator of Reference Example 4) 0.3 g Diethylene glycol dimethyl ether 13.7 g A pattern formation process using the above photoresist composition is explained below with reference to FIG. 2. The photoresist composition 2 was spin-coated on a semiconductor substrate 1 and pre-baked on a hot plate at 90° C. for 90 seconds to obtain a photoresist composition film of 1.0 μm in thickness (FIG. 2(a)). Then, the film was selectively exposed to KrF excimer laser beams 3 having a wavelength of 248.4 nm through a mask 4 (FIG. 2(b)). After post-baking on a hot plate at 100° C. for 90 seconds, the film was developed with an alkali developing solution (a 2.38% aqueous tetramethylammonium hydroxide solution) for 60 seconds to dissolve away only the exposed portion of the photoresist composition 2, whereby a positive pattern 2a was obtained (FIG. 2(c)).

The positive pattern obtained showed a resolution of 0.25 μm line-and-space. In this case, the exposure dose was about 5 $mJ/cm^2$.

When a pattern change with a delay time between exposure and post exposure bake was measured using said photoresist composition, 0.25 μm line-and-space could be resolved without any trouble even after the lapse of 8 hours.

EXAMPLES 3 to 30

Photoresist compositions were prepared according to the respective recipes shown in Table 1.

TABLE 1

| Example No. | Photoresist composition | |
|---|---|---|
| 3 | Poly[p-(1-ethoxyethoxy)styrene/p-hydroxystyrene] (Polymer of Synthesis Example 3) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 4 | Poly[p-(1-methoxy-1-methoxyethoxy)-styrene/p-hydroxystyrene (Polymer of Synthesis Example 7) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 5 | Poly[p-(1-methoxyethoxy)styrene/p-hydroxystyrene] (Polymer of Synthesis Example 6) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 6 | Poly[p-(1-n-butoxyethoxy)styrene/p-hydroxystyrene] (Polymer of Synthesis Example 8) | 6.0 g |
| | 2-(Cyclohexylcarbonyl)-2-(p-toluenesulfonyl)propane (photoacid generator of Reference Example 4) | 0.3 g |
| | Diethylene glycol dimethyl ether | 13.7 g |
| 7 | Poly[p-(1-lethoxyethoxy)styrene/p-hydroxystyrene] (Polymer of Synthesis Example 3) | 6.0 g |
| | Bis(cyclohexylsulfonyl)-diazomethane (Photoacid generator of Reference Example 7) | 0.4 g |
| | Diethylene glycol dimethyl ether | 13.6 g |
| 8 | Poly[p-(1-ethoxyethoxy)styrene/p-hydroxystyrene] (Polymer of Synthesis Example 3) | 6.0 g |

TABLE 1-continued

| Example No. | Photoresist composition | |
|---|---|---|
| | 2,6-Dinitrobenzyl p-toluenesulfonate (Photoacid generator of Reference Example 14) | 0.3 g |
| | Diethylene glycol dimethyl ether | 13.7 g |
| 9 | Poly[p-(1-methoxy-1-methylethoxy)-styrene/p-hydroxystyrene] (Polymer of Synthesis Example 7) | 6.0 g |
| | Bis(1,1-dimethylethylsulfonyl)-diazomethane (Photoacid generator of Reference Example 9) | 0.3 g |
| | Diethylene glycol dimethyl ether | 13.7 g |
| 10 | Poly[p-(1-ethoxyethoxy)styrene/p-hydroxystyrene] (Polymer of Synthesis Example 3) | 6.0 g |
| | 2-Methyl-2-(p-toluenesulfonyl)-propiophenone (Photoacid generator of Reference Example 5) | 0.5 g |
| | Diethylene glycol dimethyl ether | 13.5 g |
| 11 | Poly[p-(1-ethoxyethoxy)styrene/p-hydroxystyrene] (Polymer of Synthesis Example 5) | 6.0 g |
| | Bis(cyclohexylsulfonyl)diazomethane (Photoacid generator of Reference Example 7) | 0.3 g |
| | Diethylene glycol dimethyl ether | 13.7 g |
| 12 | Poly[p-(1-ethoxyethoxy)styrene/p-hydroxystyrene/fumaronitrile] (Polymer of Synthesis Example 9) | 6.0 g |
| | 2,4-Dimethyl-2-(p-toluenesulfonyl)-pentan-3-one (Photoacid generator of Reference Example 6) | 0.3 g |
| | Diethylene glycol dimethyl ether | 13.7 g |
| 13 | Poly[p-(1-ethoxyethoxy)styrene/p-styrene] (Polymer of is Example 4) | 6.0 g |
| | Bis(cyclohexylsulfonyl)-diazomethane (Photoacid generator of Reference Example 7) | 0.3 g |
| | Diethylene glycol dimethyl ether | 13.7 g |
| 14 | Poly[p-(1-ethoxyethoxy)styrene/p-hydroxystyrene] (Polymer of Synthesis Example 1) | 6.0 g |
| | Bis(cyclohexylsulfonyl)-diazomethane (Photoacid generator of Reference Example 7) | 0.4 g |
| | Diethylene glycol dimethyl ether | 13.6 g |
| 15 | Poly[p-(1-ethoxyethoxy)styrene/p-hydroxystyrene] (Polymer of Synthesis Example 4) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 16 | Poly[p-(1-ethoxyethoxy)styrene/p-hydroxystyrene] (Polymer of Synthesis Example 1) | 6.0 g |
| | 2-Methyl-2-(p-toluenesulfonyl)-propiophenone (Photoacid generator of Reference Example 5) | 0.3 g |
| | Diethylene glycol dimethyl ether | 13.7 g |
| 17 | Poly[p-1-ethoxyethoxy)styrene/p-hydroxystyrene] (Polymer of Synthesis Example 5) | 6.0 g |
| | Bis(1,1-dimethylethylsulfonyl)-diazomethane (Photoacid generator of Reference Example 9) | 0.3 g |
| | Diethylene glycol dimethyl ether | 13.7 g |
| 18 | Poly[p-(1-ethoxyethoxy)styrene/p-hydroxystyrene/tert-butyl methacrylate] (Polymer of Synthesis Example 10) | 6.0 g |
| | Methylsulfonyl p-toluenesulfonyl-diazomethane (Photoacid generator of Reference Example 8) | 0.3 g |
| | Diethylene glycol dimethyl ether | 13.7 g |
| 19 | Poly[p-(1-ethoxyethoxy)styrene/p-hydroxyethylene/tert-butyl methacrylate] (Polymer of Synthesis Example 10) | 6.0 g |
| | 1-Diazo-1-cyclohexylsulfonyl-3,3-dimethyl-2-butanone (Photoacid generator of Reference Example 10) | 0.3 g |
| | Diethylene glycol dimethyl ether | 13.7 g |
| 20 | Poly[p-(1-methoxyethoxy)styrene/p-hydroxystyrene] (Polymer of Synthesis Example 6) | 6.0 g |
| | 1-Diazo-1-methylsulfonyl-4-phenyl-2-butanone (Photoacid generator of Reference Example 11) | 0.3 g |
| | Ethyl lactate | 13.7 g |
| 21 | Poly[p-(1-ethoxyethoxy)styrene/p-hydroxystyrene] (Polymer of Synthesis Example 2) | 6.0 g |
| | Bis(cyclohexylsulfonyl)diazomethane (Photoacid generator of Reference Example 7) | 0.4 g |
| | Diethylene glycol dimethyl ether | 13.6 g |
| 22 | Poly[p-(1-methoxy-1-methyethoxy)-styrene/p-hydroxystyrene) (Polymer of Synthesis Example 7) | 6.0 g |
| | Bis(cyclohexylsulfonyl)-diazomethane (Photoacid generator of Reference Example 7) | 0.3 g |
| | Diethylene glycol dimethyl ether | 13.7 g |
| 23 | Poly[p-(1-ethoxyethoxy)styrene/p-hydroxystyrene] (Polymer of Synthesis Example 3) | 6.0 g |
| | 1-Diazo-1-(p-toluenesulfonyl)-3,3-dimethyl-2-butanone (Photoacid generator of Reference Example 12) | 0.3 g |
| | Propylene glycol monomethyl ether acetate | 13.7 g |
| 24 | Poly[p-(1-ethoxyethoxy)styrene/p-hydroxystyrene] (Polymer of Synthesis Example 5) | 6.0 g |
| | 1-Diazo-1-(1,1-dimethylethyl-sulfonyl)-3,3-dimethyl-2-butanone (Photoacid generator of Reference Example 12) | 0.4 g |
| | Methyl 3-methoxypropionate | 13.6 g |
| 25 | Poly[p-(1-ethoxyethoxy)styrene/p-hydroxystyrene] (Polymer of Synthesis Example 3) | 6.0 g |
| | 2-(Cyclohexylcarbonyl)-(p-toluenesulfonyl)propane (Photoacid generator of Reference Example 4) | 0.3 g |
| | Ethyl lactate | 13.7 g |
| 26 | Poly[p-(1-methoxy-1-methyethoxy)-styrene/p-hydroxystyrene] (Polymer Synthesis Exmaple 7) | 5.5 g |
| | 1-Acetyl-1-(1-methylethyl-sulfonyl)diazomethane (Photoacid generator of Reference Example 13) | 0.2 g |
| | Propylene glycol monomethyl ether acetate | 14.3 g |
| 27 | Poly[p-(1-n-butoxyethoxy)-styrene/p-hydroxystyrene] (Polymer of Synthesis Example 8) | 6.0 g |
| | Bis(cyclohexylsulfonyl)-methane (Photoacid generator Reference Example 7) | 0.3 g |
| | Diethylene glycol dimethyl ether | 13.7 g |
| 28 | Poly[p-(1-methoxyethoxy)styrene/p-hydroxystyrene] (Polymer of Synthesis Example 6) | 5.8 g |
| | Cyclohexyl 2-diazo-2-benzenesulfonylacetate (Photoacid generator of | 0.2 g |

TABLE 1-continued

| Example No. | Photoresist composition | |
|---|---|---|
| | Reference Example 15) | |
| 29 | Diethylene glycol dimethyl ether | 14.0 g |
| | Poly[p-(1-ethoxyethoxy)styrene/ p-hydroxystyrene/tert-butyl methacrylate] (polymer of Synthesis Example 10) | 6.0 g |
| | 2,6-Dinitrobenzyl p-toluene-sulfonate (photoacid generator of Reference Example 14) | 0.1 g |
| | Ethyl lactate | 13.9 g |
| 30 | Poly[p-1-ethoxyethoxy)styrene/ p-hydroxystyrene/fumaronitrile] (Polymer of Synthesis Example 9) | 6.0 g |
| | 1-Acetyl-1-(1-methylethylsulfonyl)-diazomethane (Photoacid generator of Reference Example 13) | 0.3 g |
| | Diethylene glycol dimethyl ether | 13.6 g |

Pattern formation was carried out in the same manner as in Example 2 except for using each photoresist composition prepared in the above. The results obtained are shown in Table 2.

TABLE 2

| Example No. | Exposure dose (mJ/cm²) | Interval between exposure and heat treatment, and resolution | | |
|---|---|---|---|---|
| | | At once | 30 min | 8 hrs |
| 3 | 15 | 0.30 μm L/S | 0.30 μm L/S | 0.30 μm L/S |
| 4 | 20 | 0.30 μm L/S | 0.30 μm L/S | 0.30 μm L/S |
| 5 | 8 | 0.25 μm L/S | 0.25 μm L/S | 0.25 μm L/S |
| 6 | 15 | 0.30 μm L/S | 0.30 μm L/S | 0.30 μm L/S |
| 7 | 15 | 0.30 μm L/S | 0.30 μm L/S | 0.30 μm L/S |
| 8 | 8 | 0.30 μm L/S | 0.30 μm L/S | 0.30 μm L/S |
| 9 | 16 | 0.22 μm L/S | 0.22 μm L/S | 0.22 μm L/S |
| 10 | 8 | 0.30 μm L/S | 0.30 μm L/S | 0.30 μm L/S |
| 11 | 18 | 0.22 μm L/S | 0.22 μm L/S | 0.22 μm L/S |
| 12 | 16 | 0.30 μm L/S | 0.30 μm L/S | 0.30 μm L/S |
| 13 | 15 | 0.30 μm L/S | 0.30 μm L/S | 0.30 μm L/S |
| 14 | 15 | 0.22 μm L/S | 0.22 μm L/S | 0.22 μm L/S |
| 15 | 15 | 0.30 μm L/S | 0.30 μm L/S | 0.30 μm L/S |
| 16 | 12 | 0.22 μm L/S | 0.22 μm L/S | 0.22 μm L/S |
| 17 | 18 | 0.22 μm L/S | 0.22 μm L/S | 0.22 μm L/S |
| 18 | 10 | 0.30 μm L/S | 0.30 μm L/S | 0.30 μm L/S |
| 19 | 20 | 0.30 μm L/S | 0.30 μm L/S | 0.30 μm L/S |
| 20 | 12 | 0.25 μm L/S | 0.25 μm L/S | 0.25 μm L/S |
| 21 | 16 | 0.30 μm L/S | 0.30 μm L/S | 0.30 μm L/S |
| 22 | 12 | 0.22 μm L/S | 0.22 μm L/S | 0.22 μm L/S |
| 23 | 15 | 0.30 μm L/S | 0.30 μm L/S | 0.30 μm L/S |
| 24 | 12 | 0.22 μm L/S | 0.22 μm L/S | 0.22 μm L/S |
| 25 | 10 | 0.25 μm L/S | 0.25 μm L/S | 0.25 μm L/S |
| 26 | 15 | 0.25 μm L/S | 0.25 μm L/S | 0.25 μm L/S |
| 27 | 18 | 0.25 μm L/S | 0.25 μm L/S | 0.25 μm L/S |
| 28 | 18 | 0.25 μm L/S | 0.25 μm L/S | 0.25 μm L/S |
| 29 | 8 | 0.30 μm L/S | 0.30 μm L/S | 0.30 μm L/S |
| 30 | 18 | 0.30 μm L/S | 0.30 μm L/S | 0.30 μm L/S |

As is clear from Table 2, in any of Examples 3 to 30, a positive pattern could be formed as in Example 2, and 0.22 to 0.3 μm line-and-space could be resolved without any trouble even after the lapse of 8 hours between exposure and post exposure bake, as in Example 2.

COMPARATIVE EXAMPLES 1 to 9

Figure 3:
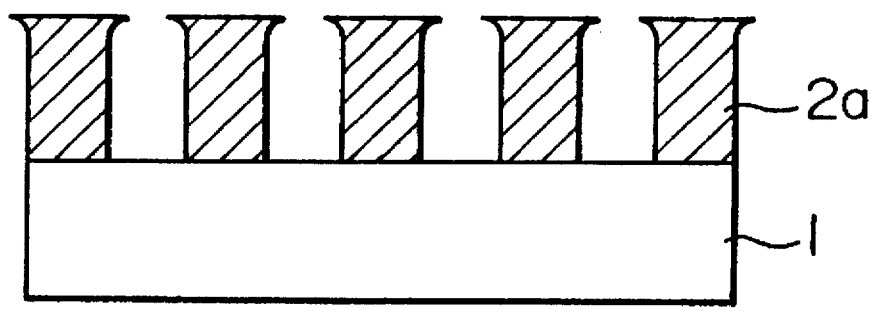
FIG. 3 is a cross-sectional view showing "T-shaped" profile observed when a positive pattern was formed using the photoresist composition of Comparative Example 1.
Figure 4:
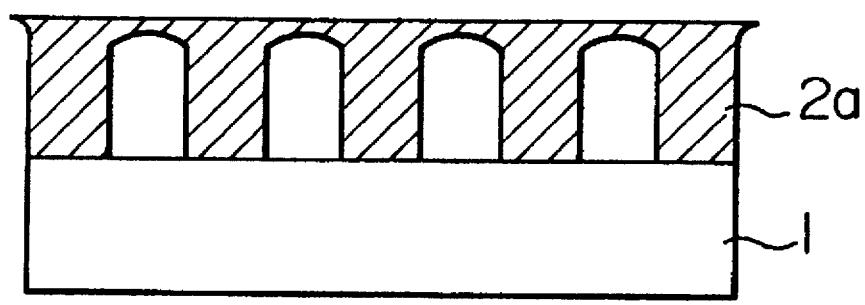
FIG. 4 is a cross-sectional view showing the impossibility of pattern formation in the case where a positive pattern is attempted to be formed using each of the photoresist compositions of Comparative Examples 2 to 6 and 9.

For comparison, photoresist compositions were prepared according to the respective recipes shown in Table 3, and pattern formation was carried out in the same manner as described in Example 2 except for using each of said photoresist compositions. The results obtained are shown in Table 4. FIG. 3 shows a pattern result ("T-shaped" profile: T-shape) obtained in Comparative Example 1 when post exposure bake and then the development were carried out after the lapse of 30 minutes after the exposure. FIG. 4 shows a pattern result (the impossibility of pattern formation) obtained in Comparative Examples 2 and 3 when the heat treatment and then the development were carried out after the lapse of 30 minutes after the exposure, and that obtained in Comparative Examples 4 to 6 and 9 when the heat treatment and then the development were carried out after the lapse of 15 minutes after the exposure.

Further, in Comparative Examples 7 and 8, wherein the heat treatment and development were carried out after exposure to light, no pattern was formed at all, since both the exposed portions and non-exposed portions were dissolved.

TABLE 3

| Comparative Example No. | Photoresist composition | |
|---|---|---|
| 1 | Poly(p-tetrahydropyranyloxystyrene/ p-hydroxystyrene (Polymer of Reference Example 1) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 2 | Poly(p-tert-butoxystyrene/ p-hydroxystyrene) (Polymer of Reference Example 2) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 3 | Poly(p-tert-butoxycarbonyloxy-styrene/p-hydroxystyrene) Polymer of Reference Example 3) | 6.0 g |
| | 2-(Cyclohexylcarbonyl)-2-(p-toluenesulfonyl)propane (Photoacid generator of Reference Example 4) | 0.3 g |
| | Diethylene glycol dimethyl ether | 13.7 g |
| 4 | Poly(p-tertrahydropyranyloxy-styrene/p-hydroxystyrene) (Polymer of Reference Example 1) | 6.0 g |
| | Diphenyliodonium hexafluoro-phosphate | 0.3 g |
| | Diethylene glycol dimethyl ether | 13.7 g |
| 5 | Poly(p-tert-butoxystyrene/p-hydroxystyrene) (Polymer of Reference Example 2) | 6.0 g |
| | Diphenyliodonium hexafluoro-phosphate | 0.3 g |
| | Diethylene glycol dimethyl ether | 13.7 g |
| 6 | Poly(p-tert-butoxycarbonyloxy-styrene/p-hydroxystyrene) (Polymer of Reference Example 3) | 6.0 g |
| | Diphenyliodonium hexafluoro-phosphate | 0.3 g |
| | Diethylene glycol dimethyl ether | 13.7 g |
| 7 | Poly[p-(1-ethoxyethoxy)styrene/ p-hydroxystyrene] (Polymer of Synthesis Example 1) | 6.0 g |
| | Diphenyliodonium hexalfuoro-phosphate | 0.3 g |
| | Diethylene glycol dimethyl ether | 13.7 g |
| 8 | Poly[p-(1-ethoxyethoxy)styrene/ p-hydroxystyrene] (Polymer of Synthesis Example 1) | 6.0 g |
| | Triphenylsulfonium hexa-fluorophosphate | 0.3 g |
| | Diethylene glycol dimethyl ether | 13.7 g |
| 9 | Poly[p-(1-ethoxyethoxy)styrene/ p-hydroxystyrene] (Polymer of | 6.0 g |

TABLE 3-continued

| Comparative Example No. | Photoresist composition | |
|---|---|---|
| | Synthesis Example 1) | |
| | Tris(tirchloromethyl)-s-triazine | 1.1 g |
| | Triethanolamine | 0.1 g |
| | Diethylene glycol dimethyl ether | 12.8 g |

TABLE 4

| Comparative Example No. | Exposure dose (mJ/cm²) | Interval between exposure and heat treatment, and resolution | | | |
|---|---|---|---|---|---|
| | | At once | 15 min | 3 min | 1 hr |
| 1 | 30 | 0.35 μm L/S | 0.35 μm L/S | "T-shaped" profile | No pattern was formed. |
| 2 | 30 | 0.35 μm L/S | 0.35 μm L/S | No pattern was formed. | — |
| 3 | 35 | 0.35 μm L/S | 0.35 μm L/S | No pattern was formed. | — |
| 4 | 3 | 0.35 μm L/S | No pattern was formed. | — | — |
| 5 | 3 | 0.35 μm L/S | No pattern was formed. | — | — |
| 6 | 3 | 0.35 μm L/S | No pattern was formed. | — | — |
| 7 | 3 | No pattern was formed. | — | — | — |
| 8 | 3 | No pattern was formed. | — | — | — |
| 9 | 6 | 0.40 μm L/S | — | — | — |

As is clear from Table 4, FIG. 3 and FIG. 4, all the photoresist compositions prepared in Comparative Examples 1 to 9 are inferior in resolution to the photoresist compositions obtained by use of the starting materials according to this invention. As is clear from Comparative Examples 1 to 6, when after the exposure, it is more than 15–30 minutes before the heat treatment (the post-baking), "T-shaped" profile occurs, or pattern formation becomes impossible. As is clear from the results of Comparative Examples 7 and 8, the whole photoresist compositions obtained by combining the polymer used in this invention with an existing iodonium salt or sulfonium salt as photoacid generator were dissolved by the development after the exposure, so that no positive pattern was formed. In the case of Comparative Example 9, wherein the resist material comprising the polymer usable in the present invention and a known combination of tris(trichloromethyl)-s-triazine/ proton doner as a photoacid generator was used, when a period of 15 to 30 minutes was required from the light exposure to heat treatment, no pattern was formed.

As is clear from the above, when the photoresist composition of this invention is used as a resist material for exposure to light having a wavelength of 300 nm or less, such as deep ultraviolet light (Deep UV), for example, KrF excimer laser beams (248.4 nm), there can easily be obtained a fine pattern which shows a very high resolution, permits stable maintenance of the dimensions of the pattern during a time delay between exposure and post exposure bake, and has a good shape of practical quater micron order. Therefore, this invention is of great value in formation of an ultra-fine pattern in the semiconductor industry.

The photoresist compositions of this invention are effective particularly in pattern formation using deep ultraviolet light or KrF excimer laser beams. They are sufficiently usable also for pattern formation using i-line light, electron beams, X-rays or the like.

What is claimed is:

1. A process for forming a pattern which comprises (i) a step of coating a photoresist composition on a substrate, the photoresist composition comprising (a) a polymer having repeating units of the formula:

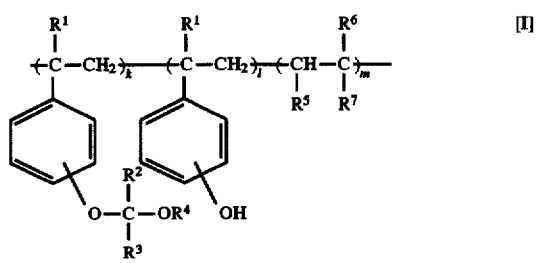

[I]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or—COOY; Y is a linear, branched or cyclic alkyl group having 1 to 6 carbon atoms; $R^5$ and $R^7$ may bind to each other to form —CO—O—CO; k and l are independently a natural number ($0.1 \leq k/(k+l) \leq 0.5$; and m is zero or a natural number (when m is a natural number, $0.05 \leq m/(k+l+m) \leq 0.50$), (b) a photosensitive compound which generates an acid upon exposure to light and, (c) a solvent capable of dissolving the components (a) and (b);

(ii) a step of exposing the coating to light having a wavelength of 300 nm or less through a mask after heat treatment, and (iii) a step of developing the coating by use of a developing solution after carrying out heat treatment if necessary.

2. A process according to claim 1, wherein the polymer of the formula [I] has repeating units of the formula:

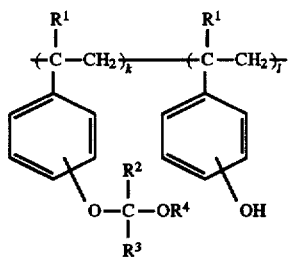

[II]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot both be hydrogen atoms, and a combination of $R^2$ and $R^3$ being able to form a methylene chain having 2 to 5 carbon atoms; $R^4$ is a linear, branched or cyclic alkyl group having 1 to 10 carbon atoms, atoms, or an aralkyl group; and k and l are independently a natural number and $(0.1 \leq k/(k+l) \leq 0.5)$.

3. A process according to claim 1, wherein the polymer of the formula [I] is a polymer in which $R^1$ is a hydrogen atom; $R^2$ is a hydrogen atom or a linear or branched alkyl group having 1 to 6 carbon atoms; $R^3$ is a linear or branched alkyl group having 1 to 6 carbon atoms; and $R^4$ is a linear or branched alkyl group having 1 to 10 carbon atoms.

4. A process according to claim 1, wherein the polymer of the formula [I] is a polymer in which $R^1$ is a hydrogen atom; $R^2$ is a hydrogen atom or a methyl group; $R^3$ is a methyl group or an ethyl group; and $R^4$ is a linear or branched alkyl group having 1 to 4 carbon atoms.

5. A process according to claim 1, wherein the weight average molecular of the polymer of the formula [I] is 3,000 to 20,000.

6. A process for forming a pattern which comprises (i) a step of coating a photoresist composition on a substrate, the photoresist composition comprising (a) a polymer having repeating units of the formula:

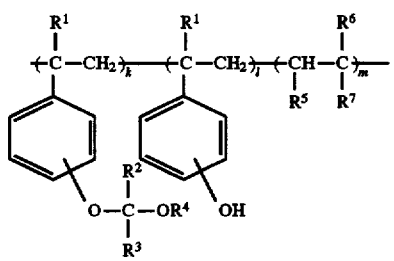

[I]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.5)$; and m is zero or a natural number (when m is a natural number, $0.05 \leq m/(k+l+m) \leq 0.50)$, (b) a photosensitive compound which generates an acid upon exposure to light and, (c) a solvent capable of dissolving the components (a) and (b);

(ii) a step of irradiating the coating with electron beams through a mask after heat treatment, and (iii) a step of developing the coating by use of a development solution after carrying out heat treatment or without heat treatment.

7. A process according to claim 2, wherein the polymer of the formula [I] has repeating units of the formula:

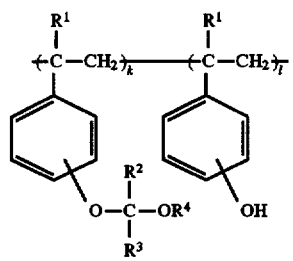

[II]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot both be hydrogen atoms, and a combination of $R^2$ and $R^3$ being able to form a methylene chain having 2 to 5 carbon atoms; $R^4$ is a linear, branched or cyclic alkyl group having 1 to 10 carbon atoms, a linear, branched or cyclic haloalkyl group having 1 to 6 carbon atoms, or an aralkyl group; and k and l are independently a natural number and $(0.1 \leq k/(k+l) \leq 0.5)$.

8. A process according to claim 6, wherein the polymer of the formula [I] is a polymer in which $R^1$ is a hydrogen atom; $R^2$ is a hydrogen atom or a linear or branched alkyl group having 1 to 6 carbon atoms; $R^3$ is a linear or branched alkyl group having 1 to 6 carbon atoms; and $R^4$ is a linear or branched alkyl group having 1 to 10 carbon atoms.

9. A process according to claim 6, wherein the polymer of the formula [I] is a polymer in which $R^1$ is a hydrogen atom; $R^2$ is a hydrogen atom or a methyl group; $R^3$ is a methyl group or an ethyl group; and $R^4$ is a linear or branched alkyl group having 1 to 4 carbon atoms.

10. A process according to claim 6, wherein the weight average molecular of the polymer of the formula [I] is 3,000 to 20,000.

11. A process for forming a pattern which comprises (i) a step of coating a photoresist composition on a substrate, the photoresist composition comprising (a) a polymer having repeating units of the formula:

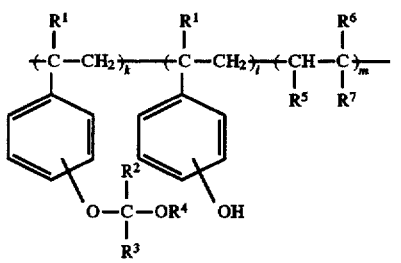

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$).

(b) a photosensitive compound which generates an acid upon exposure to light, the photosensitive compound being a compound represented by the formula:

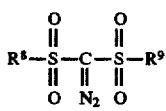

wherein $R^8$ are $R^9$ independently a linear, branched or cyclic alkyl group having 1 to 10 carbon atoms, a haloalkyl group having 1 to 10 carbon atoms, or a group represented by the formula:

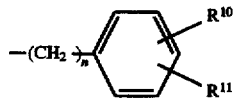

wherein $R^{10}$ and $R^{11}$ are independently a hydrogen atom, a linear or branched alkyl group having 1 to 5 carbon atoms, or a haloalkyl group having 1 to 5 carbon atoms which may be either linear or branched; and n is zero or a natural number, and, (c) a solvent capable of dissolving the components (a) and (b);

(ii) a step of exposing the coating to light having a wavelength of 300 nm or less through a mask after heat treatment, and (iii) a step of developing the coating by use of a developing solution after carrying out heat treatment if necessary.

12. A process for forming a pattern which comprises (i) a step of coating a photoresist composition on a substrate, the photoresist composition comprising (a) a polymer having repeating units of the formula:

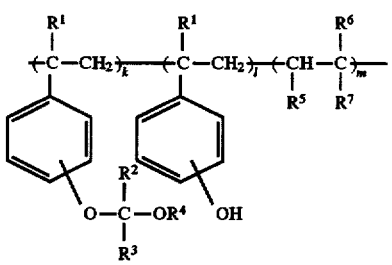

wherein $R^1$ is a hydrogen atom or a methyl group; $R^2$ and $R^3$ are independently a hydrogen atom, or a linear, branched or cyclic alkyl group having 1 to 6 carbon atoms provided that $R^1$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

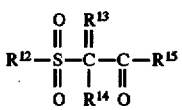

wherein $R^{12}$ is a linear, branched or cyclic alkyl group having 1 to 10 carbon atoms, an aralkyl group, a trifluoromethyl group, a phenyl group or a tolyl group; $R^{13}$ and $R^{14}$ are independently a hydrogen atom, or a linear or branched alkyl group having 1 to 5 carbon atoms; and $R^{15}$ is a linear, branched or cyclic alkyl group having 1 to 10 carbon atoms, a phenyl group, a halogen-substituted phenyl group, an alkyl-substituted phenyl group, an alkoxy-substituted phenyl group, or an alkylthio-substituted phenyl group, and, (c) a solvent capable of dissolving the components (a) and (b);

(ii) a step of exposing the coating to light having a wavelength of 300 nm or less through a mask after heat treatment, and (iii) a step of developing the coating by use of a developing solution after carrying out heat treatment if necessary.

13. A process for forming a pattern which comprises (i) a step of coating a photoresist composition on a substrate, the photoresist composition comprising (a) a polymer having repeating units of the formula:

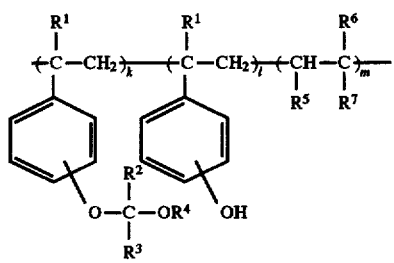

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

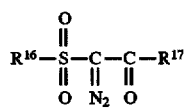 [VI]

wherein $R^{16}$ is a linear, branched or cyclic alkyl group having 1 to 10 carbon atoms, an aralkyl group, a trifluoromethyl group, a phenyl group or a tolyl group; and $R^{17}$ is a linear, branched or cyclic alkyl group having 1 to 10 carbon atoms, an aralkyl group or an alkoxy group, and, (c) a solvent capable of dissolving the components (a) and (b);

(ii) a step of exposing the coating to light having a wavelength of 300 nm or less through a mask after heat treatment, and (iii) a step of developing the coating by use of a developing solution after carrying out heat treatment if necessary.

14. A process for forming a pattern which comprises (i) a step of coating a photoresist composition on a substrate, the photoresist composition comprising
(a) a polymer having repeating units of the formula:

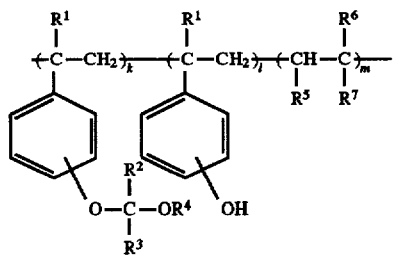

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

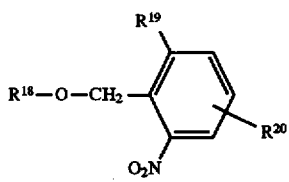 [VII]

wherein $R^{18}$ is a trichloroacetyl group, a p-toluenesulfonyl group, a p-trifluoromethylbenzenesulfonyl group, a methanesulfonyl group or a trifluoromethanesulfonyl group; and $R^{19}$ and $R^{20}$ are independently a hydrogen atom, a halogen atom or a nitro group, and, (c) a solvent capable of dissolving the components (a) and (b);

(ii) a step of exposing the coating to light having a wavelength of 300 nm or less through a mask after heat treatment, and (iii) a step of developing the coating by use of a developing solution after carrying out heat treatment if necessary.

15. A process for forming a pattern which comprises (i) a step of coating a photoresist composition on a substrate, the photoresist composition comprising
(a) a polymer having repeating units of the formula:

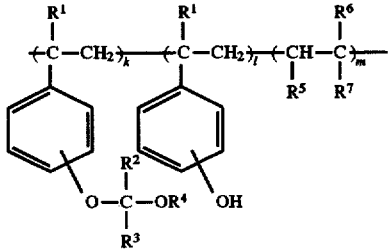

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

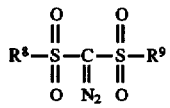
[III]

wherein $R^8$ and $R^9$ are independently a linear, branched or cyclic alkyl group having 1 to 10 carbon atoms, a haloalkyl group having 1 to 10 carbon atoms, or a group represented by the formula:

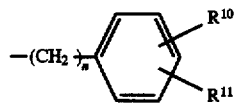
[IV]

wherein $R^{10}$ and $R^{11}$ are independently a hydrogen atom, a linear or branched alkyl group having 1 to 5 carbon atoms, or a haloalkyl group having 1 to 5 carbon atoms which may be either linear or branched; and n is zero or a natural number, and, (c) a solvent capable of dissolving the components (a) and (b);

(ii) a step of irradiating the coating with electron beams through a mask after heat treatment, and (iii) a step of developing the coating by use of a development solution after carrying out heat treatment or without heat treatment.

16. A process for forming a pattern which comprises (i) a step of coating a photoresist composition on a substrate, the photoresist composition comprising (a) a polymer having repeating units of the formula:

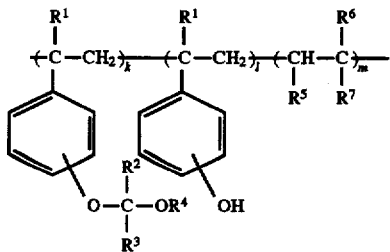
[I]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or—COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

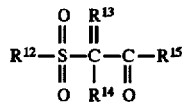
[V]

wherein $R^{12}$ is a linear, branched or cyclic alkyl group having 1 to 10 carbon atoms, an aralkyl group, a trifluoromethyl group, a phenyl group or a tolyl group; $R^{13}$ and $R^{14}$ are independently a hydrogen atom, or a linear or branched alkyl group having 1 to 5 carbon atoms; and $R^{15}$ is a linear, branched or cyclic alkyl group having 1 to 10 carbon atoms, a phenyl group, a halogen-substituted phenyl group, an alkyl-substituted phenyl group, an alkoxy-substituted phenyl group, or an alkylthio-substituted phenyl group, and, (c) a solvent capable of dissolving the components (a) and (b);

(ii) a step of irradiating the coating with electron beams through a mask after heat treatment, and (iii) a step of developing the coating by use of a development solution after carrying out heat treatment or without heat treatment.

17. A process for forming a pattern which comprises (i) a step of coating a photoresist composition on a substrate, the photoresist composition comprising (a) a polymer having repeating units of the formula:

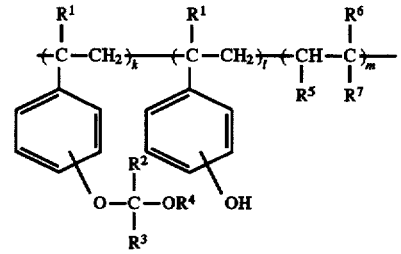
[I]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or—COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50$), (b) a photosensitive compound which generates an acid upon exposure to light, the photosensitive compound being a compound represented by the formula:

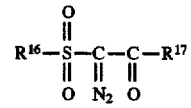
[VI]

wherein $R^{16}$ is a linear, branched or cyclic alkyl group having 1 to 10 carbon atoms, an aralkyl group, a trifluoromethyl group, a phenyl group or a tolyl group; and $R^{17}$ is a linear, branched or cyclic alkyl group having 1 to 10 carbon atoms, an aralkyl group or an alkoxy group, and, (c) a solvent capable of dissolving the components (a) and (b);

(ii) a step of irradiating the coating with electron beams through a mask after heat treatment, and (iii) a step of developing the coating by use of a development solution after carrying out heat treatment or without heat treatment.

18. A process for forming a pattern which comprises
(i) a step of coating a photoresist composition on a substrate, the photoresist composition comprising
(a) a polymer having repeating units of the formula:

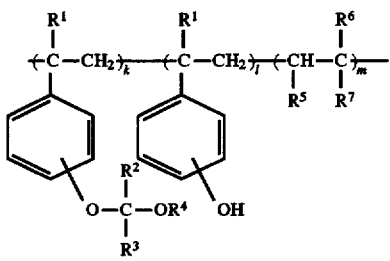
[I]

wherein $R^1$ is a hydrogen atom or a methyl group; $R^2$ and $R^3$ are independently a hydrogen atom, or a linear, branched or cyclic alkyl group having 1 to 6 carbon atoms provided that $R^2$ and $R^3$ cannot be hydrogen atoms at the same time, and a combination of $R^2$ and $R^3$ being able to form a methylene chain having 2 to 5 carbon atoms; $R^4$ is a linear, branched or cyclic alkyl groups having 1 to 10 carbon atoms, a linear, branched or cyclic haloalkyl group having 1 to 6 carbon atoms, or an aralkyl group; $R^5$ is a hydrogen atom or a cyano group; $R^7$ is a hydrogen atom, a cyano group or —COOY; Y is a linear, branched or cyclic alkyl group having 1 to 6 carbon atoms; $R^5$ and $R^7$ may bind to each other to form —CO—O—CO; k and l are independently a natural number $(0.1 \leq k/(k+l) \leq 0.9)$; and m is zero or a natural number (when m is a natural number, $0.05 \leq m/(k+l+m) \leq 0.50)$, (b) a photosensitive compound which generates an acid upon exposure to light, the photosensitive compound being a compound represented by the formula:

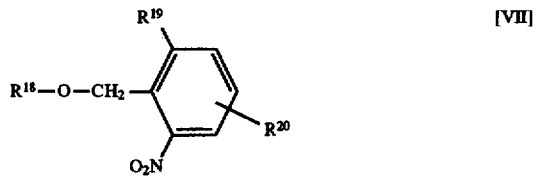
[VII]

wherein $R^{18}$ is a trichloroacetyl group, a p-toluenesulfonyl group, a p-trifluoromethylbenzenesulfonyl group, a methanesulfonyl group or a trifluoromethanesulfonyl group; and $R^{19}$ and $R^{20}$ are independently a hydrogen atom, a halogen atom or a nitro group, and, (c) a solvent capable of dissolving the components (a) and (b);

(ii) a step of irradiating the coating with electron beams through a mask after heat treatment, and (iii) a step of developing the coating by use of a development solution after carrying out heat treatment or without heat treatment.

* * * * *